(12) United States Patent
Miyazaki

(10) Patent No.: US 10,748,965 B2
(45) Date of Patent: Aug. 18, 2020

(54) SEMICONDUCTOR DEVICE

(71) Applicant: Toshiba Memory Corporation, Tokyo (JP)

(72) Inventor: Takayuki Miyazaki, Setagaya Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/290,406

(22) Filed: Mar. 1, 2019

(65) Prior Publication Data

US 2020/0091239 A1 Mar. 19, 2020

(30) Foreign Application Priority Data

Sep. 18, 2018 (JP) ................................. 2018-174252

(51) Int. Cl.
*G11C 11/00* (2006.01)
*H01L 27/24* (2006.01)
(Continued)

(52) U.S. Cl.
CPC ...... *H01L 27/2463* (2013.01); *G01R 31/2884* (2013.01); *G11C 13/0069* (2013.01); *H01L 23/528* (2013.01); *H01L 23/5223* (2013.01); *H01L 28/86* (2013.01); *H01L 45/1233* (2013.01); *H01L 45/1253* (2013.01); *G11C 13/0007* (2013.01); *G11C 2013/0078* (2013.01); *G11C 2213/32* (2013.01); *G11C 2213/52* (2013.01); *G11C 2213/72* (2013.01);
(Continued)

(58) Field of Classification Search
CPC . G11C 11/00; G11C 13/0069; G11C 13/0007; G11C 2013/0078; G11C 2213/32; G11C 2213/52; H01L 27/2463; H01L 23/5223; G01R 31/2884
USPC ..................... 365/46, 94, 100, 113, 129–188
See application file for complete search history.

(56) References Cited

U.S. PATENT DOCUMENTS

| 5,495,440 A * | 2/1996 | Asakura ............. G11C 11/4097 365/149 |
| 7,072,204 B2 * | 7/2006 | Tsukikawa ............... G11C 7/18 257/E21.656 |

(Continued)

FOREIGN PATENT DOCUMENTS

| JP | 5661127 B2 | 1/2015 |
| JP | 5783961 B2 | 9/2015 |
| JP | 3846789 B2 | 1/2016 |

*Primary Examiner* — Harry W Byrne
(74) *Attorney, Agent, or Firm* — Kim & Stewart LLP

(57) ABSTRACT

A semiconductor device includes a plurality of first conductive lines in a first wiring layer, a plurality of second conductive lines in a second wiring layer, and a plurality of memory cells between the first and second conductive lines in a first direction in a first region. A plurality of third conductive lines in the first wiring layer, a plurality of fourth conductive lines in the second wiring, and a plurality of first memory lines are in a second region. The third conductive lines extends in a second direction and are spaced from each other in a third direction. The fourth conductive lines extend in the second direction and are spaced in the third direction. The first memory lines are between the third conductive lines and the fourth conductive lines in the first direction. The first memory lines comprise the same materials as the memory cells.

20 Claims, 18 Drawing Sheets

(51) Int. Cl.

| | |
|---|---|
| *H01L 23/522* | (2006.01) |
| *H01L 49/02* | (2006.01) |
| *G11C 13/00* | (2006.01) |
| *H01L 45/00* | (2006.01) |
| *G01R 31/28* | (2006.01) |
| *H01L 23/528* | (2006.01) |
| *H01L 29/868* | (2006.01) |

(52) U.S. Cl.
CPC ........ *H01L 27/2409* (2013.01); *H01L 29/868* (2013.01); *H01L 45/146* (2013.01)

(56) References Cited

U.S. PATENT DOCUMENTS

| | | | |
|---|---|---|---|
| 8,416,609 B2 | 4/2013 | Meade | |
| 8,611,122 B2* | 12/2013 | Kajigaya | G11C 5/025 |
| | | | 365/148 |
| 8,614,910 B2 | 12/2013 | Shionoiri | |
| 8,822,966 B2 | 9/2014 | Takahashi et al. | |
| 9,123,410 B2 | 9/2015 | Castro et al. | |
| 9,830,970 B2 | 11/2017 | Meade | |
| 2005/0219893 A1* | 10/2005 | Tsukikawa | G11C 7/18 |
| | | | 365/149 |

\* cited by examiner

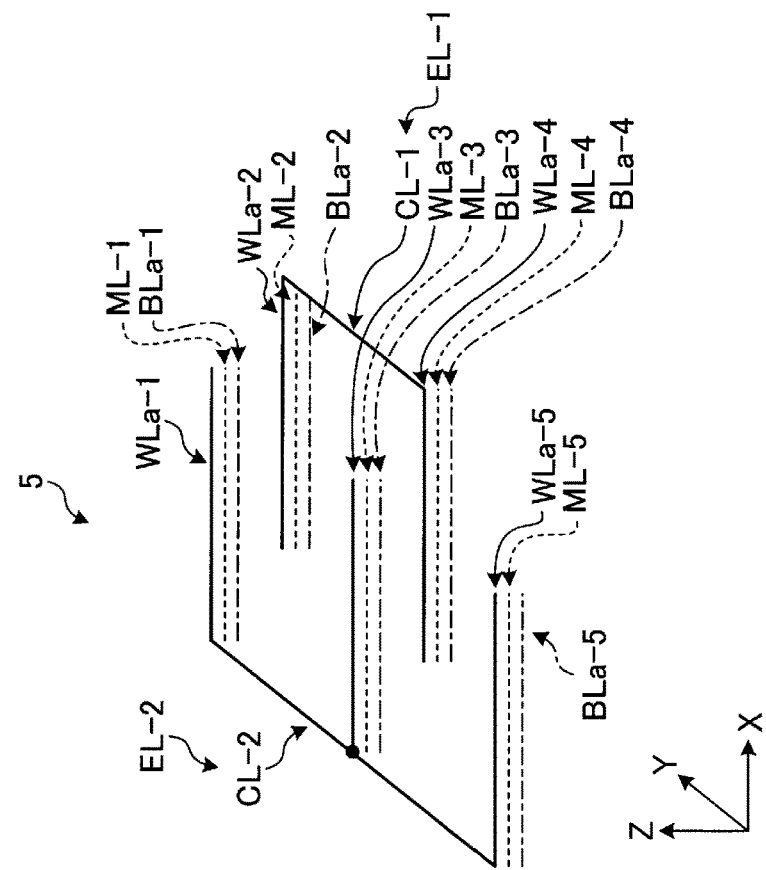
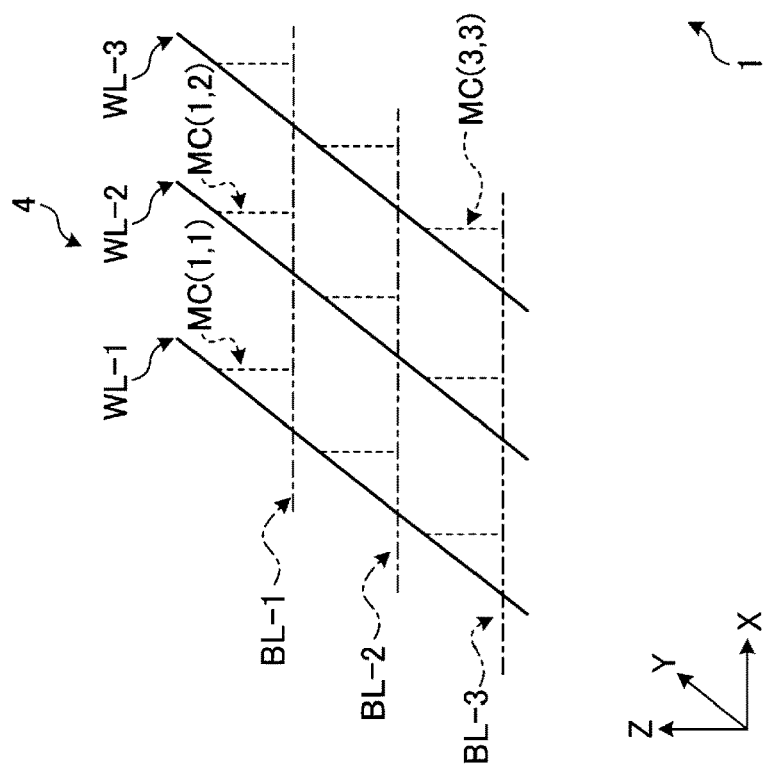

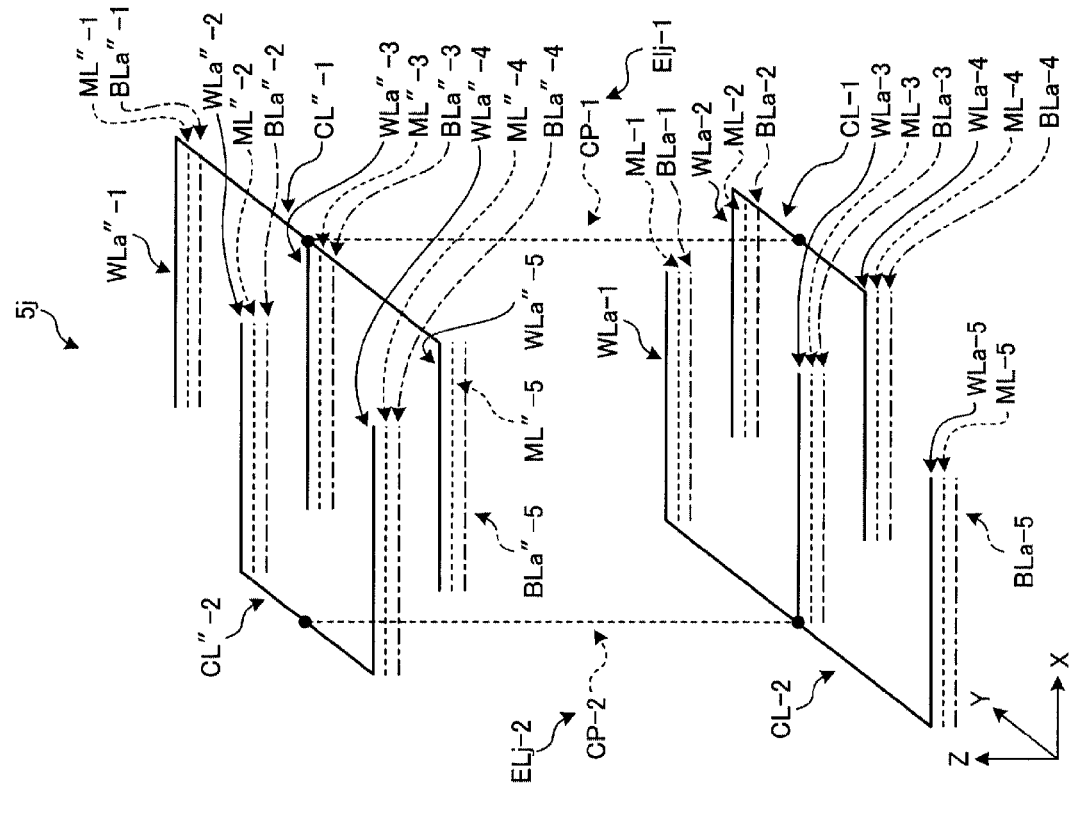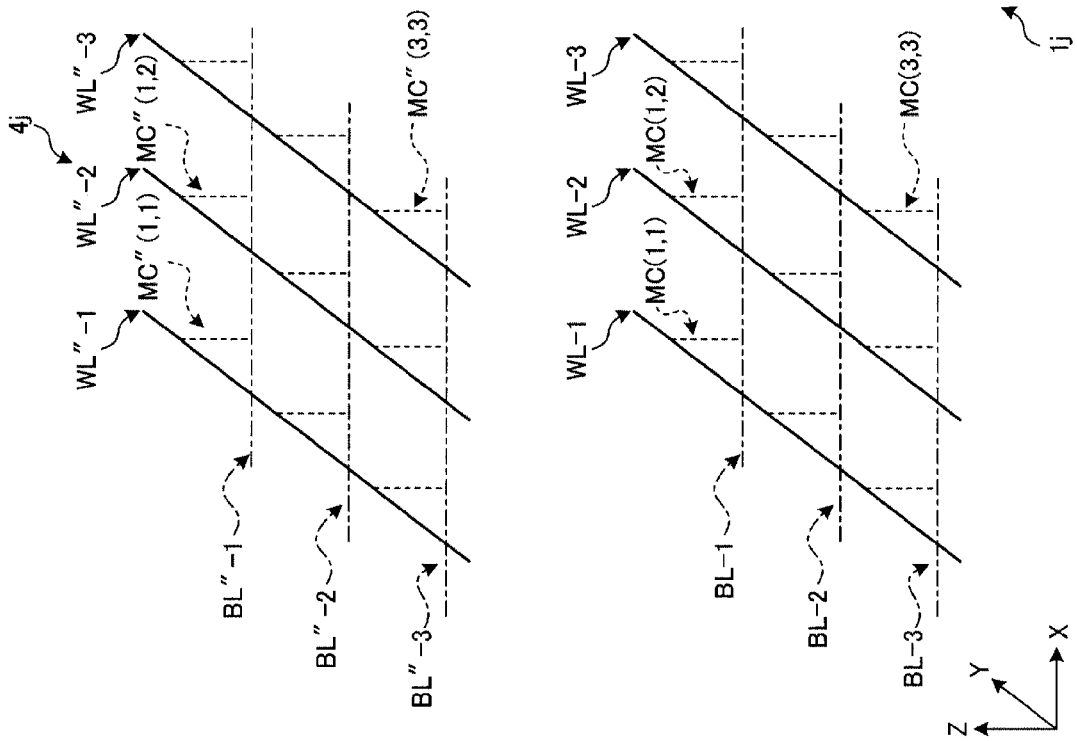

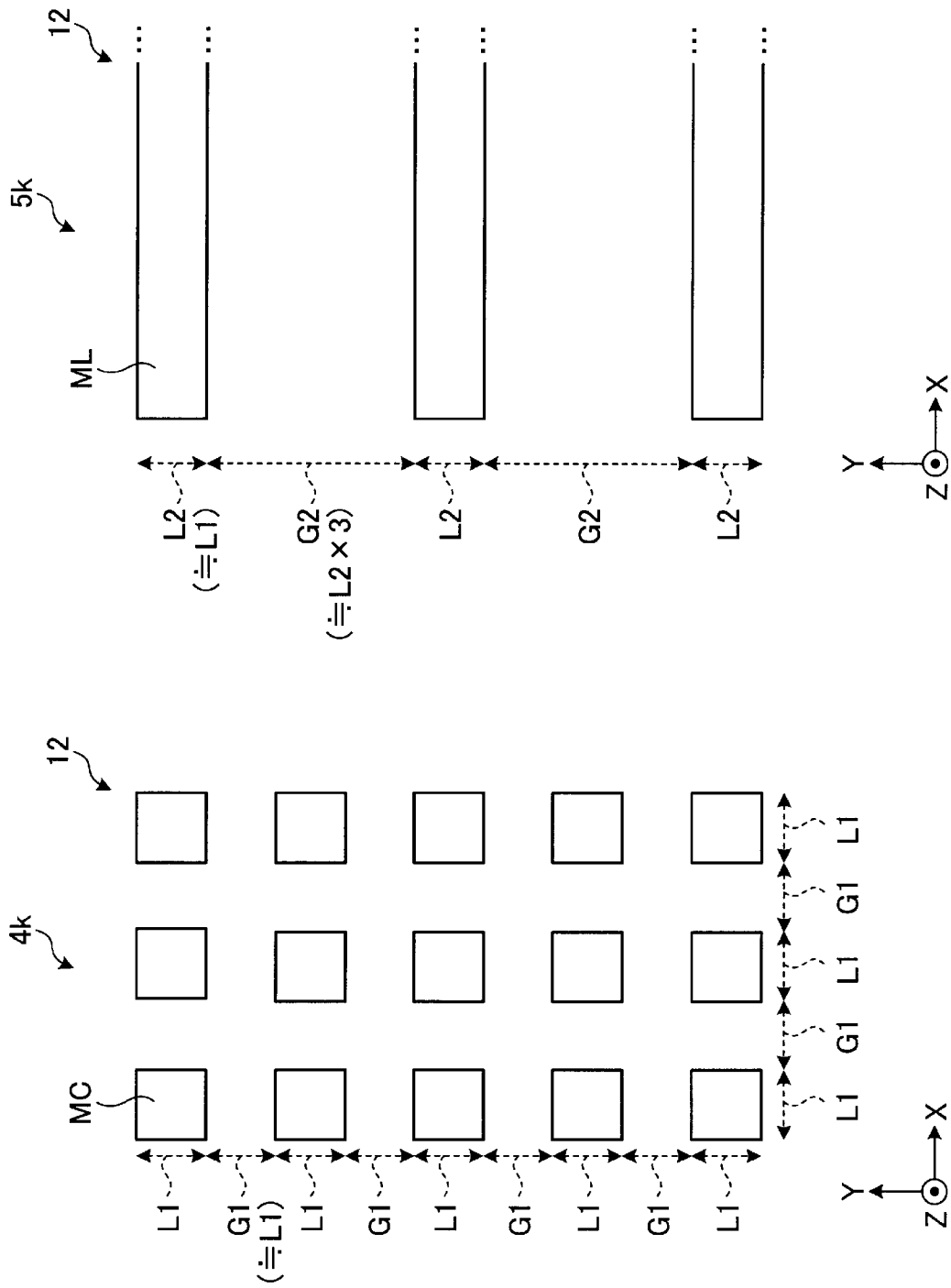

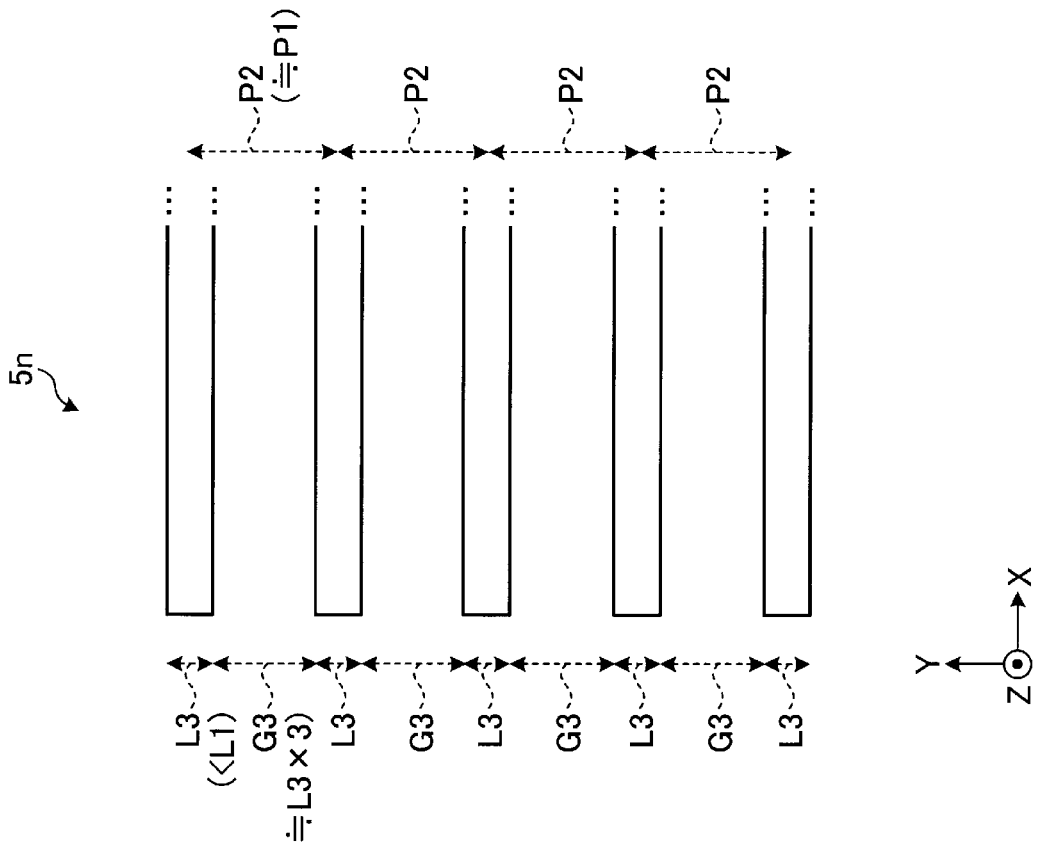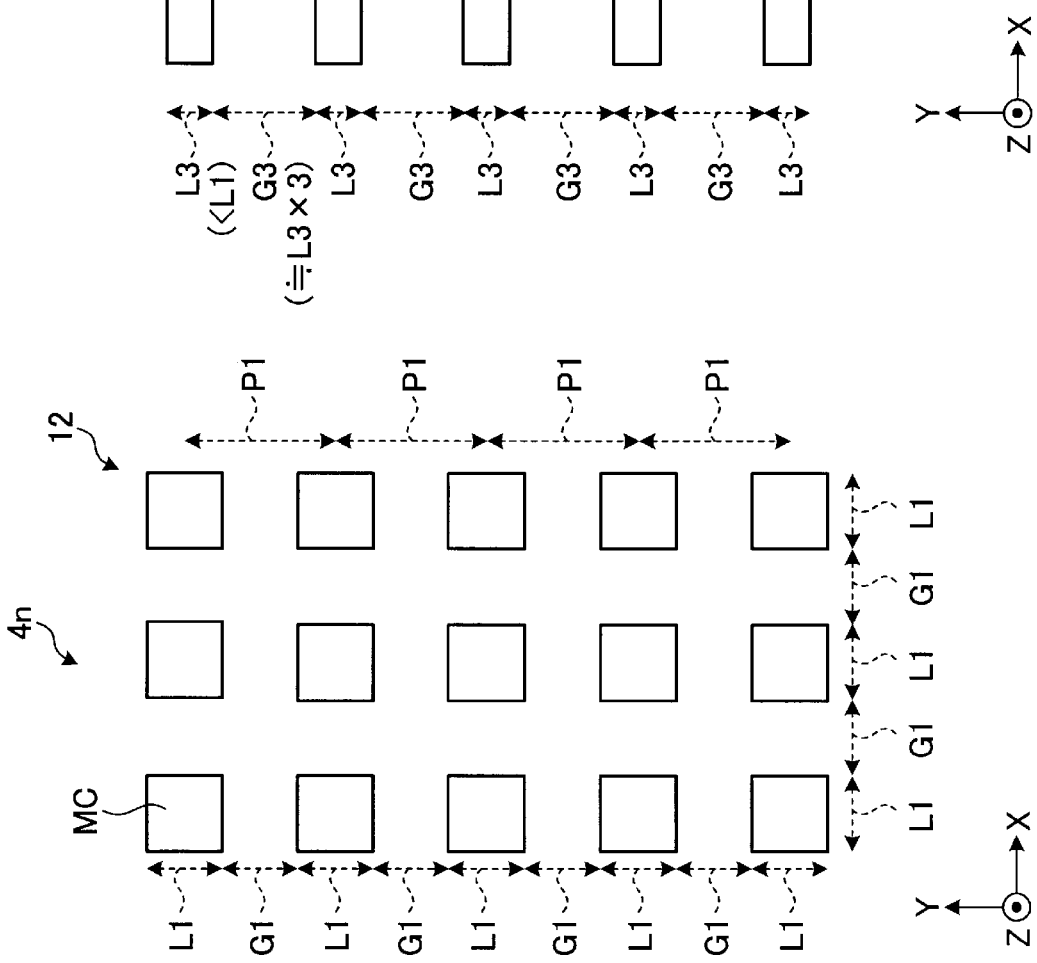

SEMICONDUCTOR DEVICE

CROSS-REFERENCE TO RELATED APPLICATION

This application is based upon and claims the benefit of priority from Japanese Patent Application No. 2018-174252, filed Sep. 18, 2018, the entire contents of which are incorporated herein by reference.

FIELD

Embodiments described herein relate generally to a semiconductor device.

BACKGROUND

A capacitive circuit may be mounted in a semiconductor device. When doing so, it is desired to reduce a circuit area of the capacitive circuit.

DESCRIPTION OF THE DRAWINGS

FIGS. 2A and 2B are circuit diagrams illustrating configurations of a memory cell array and a capacitive circuit in a first embodiment.

FIGS. 10A and 10B are circuit diagrams illustrating configurations of a memory cell array and a capacitive circuit according to a third embodiment.

FIGS. 14A and 14B are plan views of a memory cell array and a capacitive circuit according to a first modification example applicable to a first embodiment, a second embodiment, and a third embodiment.

FIGS. 15A and 15B are plan views of a memory cell array and a capacitive circuit according to a second modification example applicable to a first embodiment, a second embodiment, and a third embodiment.

DETAILED DESCRIPTION

Figure 1:
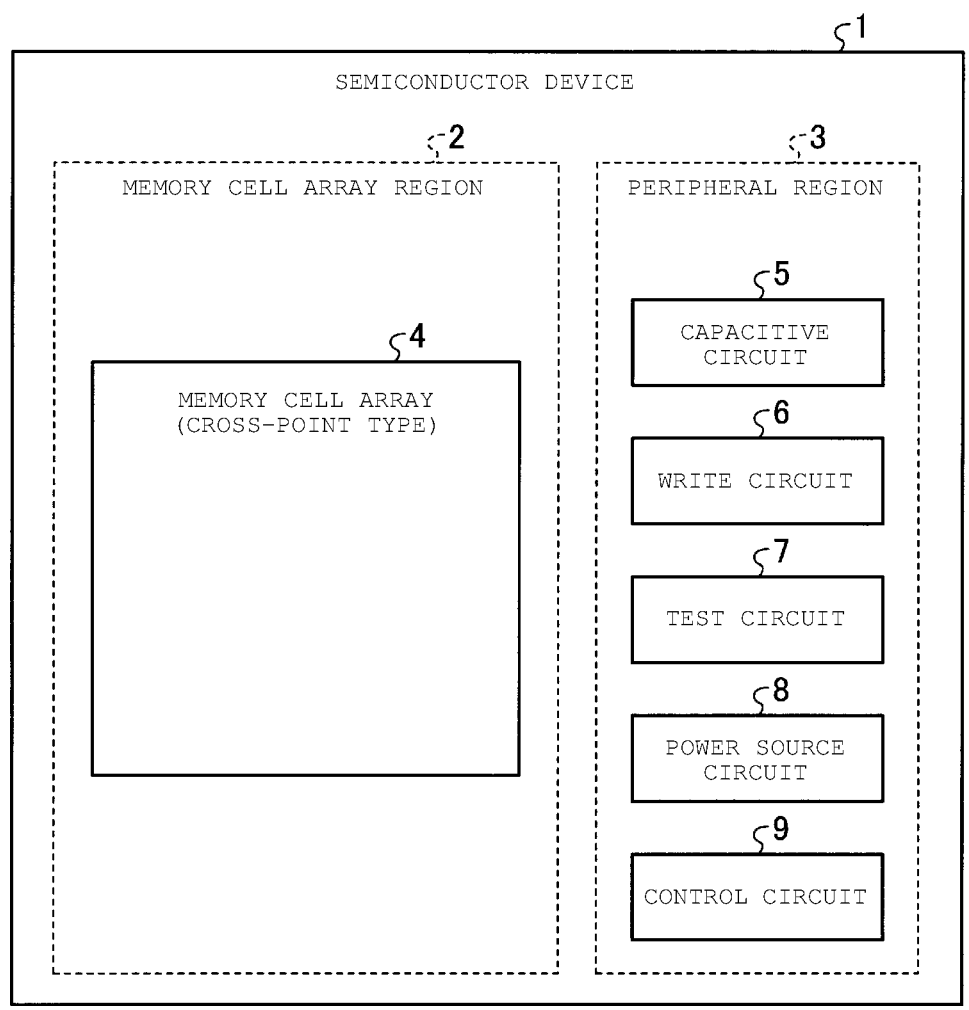
FIG. 1 is a block diagram illustrating a configuration of a semiconductor device according to a first embodiment.

In general, according to one embodiment, a semiconductor device comprises a first and second region on a substrate. A first wiring layer is on the substrate in both the first region and the second region. A second wiring layer is on the substrate in both the first region and the second region. A first memory cell layer is between the first and second wiring layers in a first direction orthogonal to the substrate. A plurality of first conductive lines is in the first wiring layer in the first region. The first conductive lines extend in a second direction that is parallel to the substrate. The first conductive lines are spaced from each other in a third direction crossing the second direction and parallel to the substrate. A plurality of second conductive lines is in the second wiring layer in the first region. The second conductive lines extend in the third direction. The second conductive lines are spaced from each other in the second direction. A first plurality of memory cells is in the first memory cell layer in the first region. These memory cells are respectively between a first conductive line and a second conductive line at a crossing point of the first conductive line and the second conductive line. A plurality of third conductive lines is in the first wiring layer in the second region. The third conductive lines extend in the second direction and are spaced from each other in the third direction. A plurality of fourth conductive lines is in the second wiring layer in the second region. The fourth conductive lines extend in the second direction and are spaced from each other in the third direction. A first plurality of memory lines is in the first memory cell layer in the second region. These memory lines are respectively between a third conductive line and a fourth conductive line. These memory lines extend coextensively in the second direction with the third and fourth conductive lines. The memory cells and the memory lines in the first memory cell layer are comprised of same materials. A capacitor element is formed in the second region by the plurality of third conductive lines, the plurality of fourth conductive lines, and the first plurality of memory lines.

Hereinafter, details of a semiconductor device according to certain example embodiments will be described with reference to the accompanying drawings. The scope of the present disclosure is not limited to these example embodiments.

First Embodiment

A semiconductor device according to a first embodiment may include one or more semiconductor chips. A capacitive circuit may be mounted in the semiconductor device. For example, a capacitive circuit that performs decoupling for removing noise received from a power source is incorporated. A capacitive circuit having a metal-oxide-metal (MOM) structure may be utilized. The MOM structure is formed by arranging two sets of wiring patterns in a comb shape, so that the teeth of one comb interdigitates with the teeth of the other comb though the combs remain spaced from each other. It is desirable to reduce the chip area (wafer die size) of the semiconductor device.

A cross-point type memory cell array may be mounted in the semiconductor device. In a cross-point type memory cell array, bit lines having a narrow line width are arranged at a fine pitch, and word lines having a narrow line width are also arranged at a fine pitch. Therefore, if a microfabrication process for forming a bit lines and word lines is applied, it is possible to form a capacitive circuit having high capacitance per unit area and to enable one process to be used for both fabrication of the memory cell array and the capacitive circuit. Thus, it would be possible to increase memory density and the capacitance of a capacitive circuit (having a MOM structure) at low cost and to reduce circuit area of the capacitive circuit having the required capacitance.

The cross-point type memory cell array has a structure in which the direction of the bit lines and the word lines intersect with each other and a memory cell (memory cell layer) is formed at the points of intersection. It is thus difficult to achieve a capacitive circuit having a MOM structure while leaving the standard structure of the cross-point type memory cell array unchanged.

In the first embodiment, a capacitive circuit is configured such that a bit line, a memory cell layer, and a word line overlap each other along a length direction, and is laid out in accordance with a MOM structure. Thus, density and capacitance of the capacitive circuit are increased, and the circuit area of the capacitive circuit is reduced.

Specifically, when the capacitive circuit is formed, the structure thereof is a modification of the configuration the structure of the memory cell array. The layout is changed such that rather than intersect at single crossing point, a word line and a bit line completely overlap each other when viewed from a direction perpendicular to a substrate (e.g., Z-direction). The memory cell layer is formed between the word line and the bit line in a line shape so as to match with the shape of the word line and the bit line. A stacked structure in which the word line, the memory cell layer, and the bit line are stacked in the direction perpendicular to the substrate serves as a portion of an electrode in the MOM structure. That is, in the capacitive circuit, a plurality of stacked structures which are configured with word lines, memory cell layers, and bit lines are arranged on the surface of the substrate as the interdigitated combs. A first electrode is obtained by electrically connecting the stacked structures having even numbers among the plurality of stacked structures. A second electrode is obtained by electrically connecting the stacked structures having odd numbers among the plurality of stacked structures. Thus, with the first electrode and the second electrode, it is possible to achieve a capacitive circuit having a MOM structure (in which two sets of patterns are arranged in interdigitated comb shapes).

More specifically, a semiconductor device 1 may be configured as illustrated in FIG. 1. FIG. 1 is a block diagram illustrating a configuration of the semiconductor device 1. The semiconductor device 1 includes a memory cell array region 2 and a peripheral region 3.

A memory cell array 4 is disposed in the memory cell array region 2. The memory cell array 4 is a cross-point type memory cell array. A plurality of memory cells is disposed between a plurality of bit lines and a plurality of word lines. A capacitive circuit 5, a write circuit 6, a test circuit 7, a power source circuit 8, and a control circuit 9 are disposed in the peripheral region 3. The write circuit 6 performs a write operation on the capacitive circuit 5. The test circuit 7 performs a test on the capacitive circuit 5. The power source circuit 8 supplies power to the components of the semiconductor device 1. The control circuit 9 performs a write operation and/or a read operation on the memory cell in the memory cell array 4.

For example, the capacitive circuit 5 may be electrically inserted in the middle of wirings from the power source circuit 8 to the components of the semiconductor device 1, and thus can perform decoupling for removing noise from power supplied to the components of the semiconductor device 1. In addition, for example, the capacitive circuit 5 may be electrically inserted in the middle of wirings from the control circuit 9 to the components of the semiconductor device 1, and thus can perform decoupling for removing noise from a control signal supplied to the components of the semiconductor device 1.

The memory cell array 4 illustrated in FIG. 1 may be configured as illustrated in FIG. 2A, for example. FIG. 2A is a circuit diagram illustrating a configuration of the memory cell array 4. In the following descriptions, a direction perpendicular to the surface of a substrate is set as a Z-direction, and two directions which are orthogonal to each other in a plane orthogonal to the Z-direction are set as an X-direction and a Y-direction. The memory cell array 4 includes bit lines BL-1, BL-2, and BL-3, memory cells MC(1, 1), MC(1, 2) . . . MC(3, 3), and word lines WL-1, WL-2, and WL-3.

The bit lines BL-1 to BL-3 (indicated by dot-dash lines in FIG. 2A) intersect with the word lines WL-1 to WL-3 (indicated by solid lines in FIG. 2A). The bit lines BL-1 to BL-3 are arranged in an interlayer insulating film 21 (see FIG. 5A). The bit lines BL are at a predetermined pitch in the Y-direction and to extend in the X-direction. FIG. 2A illustrates a case where three bit lines BL are disposed. However, the number of bit lines BL is not limited to that depicted in FIG. 2A.

The word lines WL-1 to WL-3 intersect with the bit lines BL-1 to BL-3. The word lines WL-1 to WL-3 are arranged in the interlayer insulating film 21 (see FIG. 5A), but at a level above the bit lines BL-1 to BL-3. The word lines WL are at a predetermined pitch in the X-direction and to extend in the Y-direction. FIG. 2A illustrates a case where three word lines WL are disposed. However, the number of word lines WL is not limited to that depicted in FIG. 2A.

The plurality of memory cells MC(1, 1) to MC(3, 3) (indicated by dotted lines in FIG. 2A) is arranged at positions of intersection for bit lines BL-1 to BL-3 and the word lines WL-1 to WL-3. The plurality of memory cells MC(1, 1) to MC(3, 3) is thus arranged in a matrix in a plane formed in the X-direction and the Y-direction. FIG. 2A illustrates a case where the memory cells MC are arranged in 3 rows and 3 columns (a 3×3 matrix). However, the arrangement of the memory cell MC is not limited to that depicted in FIG. 2A.

Although not specifically illustrated, a variable resistance element and a diode (rectifying element) are connected to each other in series in each of the memory cells MC. The resistance state of the variable resistance element is electrically variable and functions to store data in a non-volatile manner based on a resistance value. The diode is disposed to perform an electrical access (forming/writing/erasing/reading) to a selected cell and is disposed to prevent flowing of a leak current in the access operations.

The variable resistance element is an element transitioning between at least two resistance values, for example, a low resistance state and a high resistance state. If a predetermined set voltage is applied between both ends of the memory cell MC, for example, such that the diode is biased in a forward direction, the variable resistance element transitions from the high resistance state to the low resistance state (write, set). If a predetermined reset voltage is applied across the memory cell MC such that the diode is biased in the forward direction, the variable resistance element transitions from the low resistance state to the high resistance state (erase, reset). The variable resistance element comprises an insulating material. Thus, a step, referred to as "forming," is performed in which a set operation or a reset operation is performed to change of the electrical resistance value of the variable resistance element. Forming is performed by applying a voltage pulse having a predetermined magnitude and a predetermined pulse width to the element.

Figure 3:
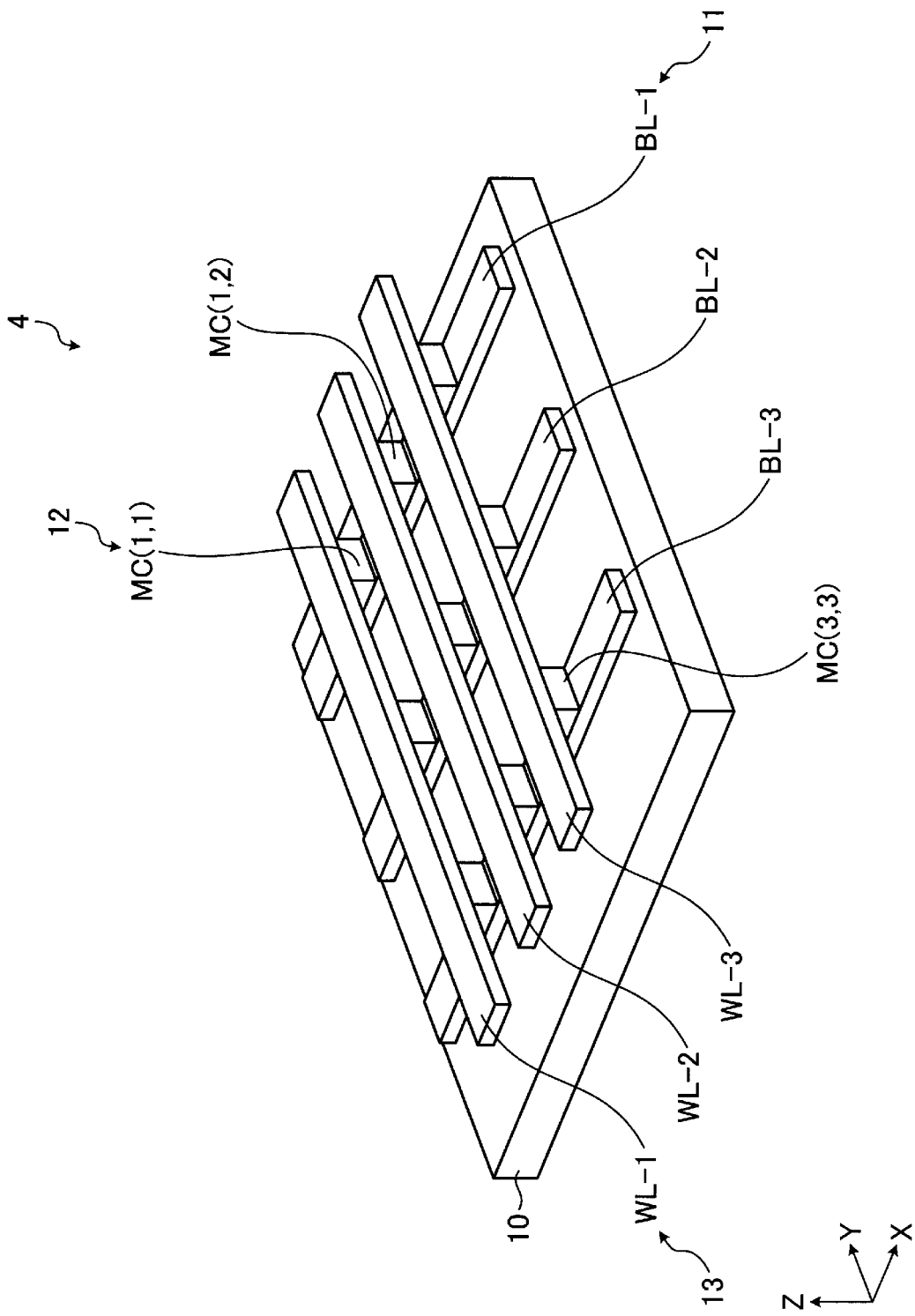
FIG. 3 depicts aspects of a memory cell array in a first embodiment.

A circuit configuration illustrated in FIG. 2A may be structured in the manner as illustrated in FIG. 3, for example. FIG. 3 is a perspective view illustrating a configuration of the memory cell array 4.

In the memory cell array 4, a first conductive layer 11, a memory layer 12, and a second conductive layer 13 are stacked in this order from the lower layer to the upper layer. The first conductive layer 11 includes the plurality of bit lines BL-1 to BL-3. The memory layer 12 includes the plurality of memory cells MC(1, 1) to MC(3, 3). The second conductive layer 13 includes the plurality of word lines WL-1 to WL-3. The cross-point type memory cell array 4 is configured such that each of the bit lines BL extends in the X-direction, each of the word lines WL extends in the Y-direction, and each of the memory cells MC is disposed between a corresponding bit line BL and a corresponding word line WL in the Z-direction.

Figure 5A:
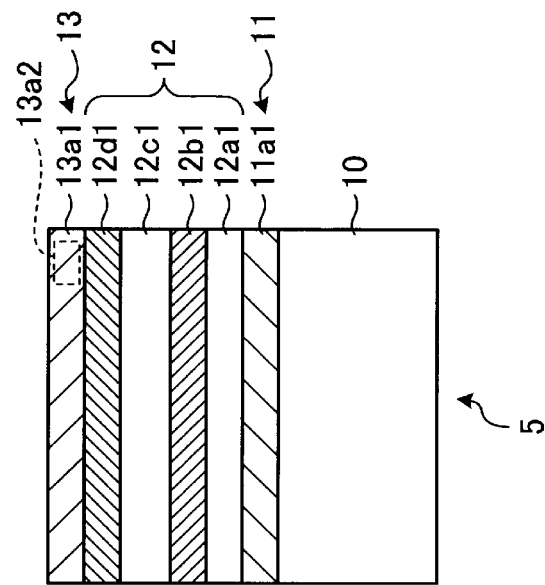
FIGS. 5A and 5B are cross-sectional views depicting aspects of a memory cell array and a capacitive circuit in a first embodiment.

FIG. 5A is a cross-sectional view illustrating the layer configuration of the memory cell array 4.

The first conductive layer 11 includes a conductive film 11a functioning as the bit line BL. The conductive film 11a is disposed on a substrate 10. The substrate 10 may be formed of a material containing a semiconductor such as silicon, as the main component. Another film (for example, an insulating film) may be disposed between the substrate 10 and the conductive film 11a. The conductive film 11a may be formed of a material containing tungsten (W), titanium (Ti), tantalum (Ta), molybdenum (Mo), ruthenium (Ru), cobalt (Co), and nitrides thereof, as the main component.

The memory layer 12 includes a diode layer 12a, a first electrode layer 12b, a variable resistance layer 12c, and a second electrode layer 12d from the lower layer to the upper layer.

The diode layer 12a is formed on the upper surface of the conductive film 11a. The diode layer 12a functions as a diode. The diode layer 12a has a metal-insulator-metal (MIM) structure or a P+ poly-silicon-intrinsic-N+ poly-silicon (PIN) structure, for example. In a case of the PIN structure, the diode layer 12a has a configuration in which an N-type layer, an I-type layer, and a P-type layer are stacked. The N-type layer is formed of a semiconductor (for example, silicon) containing N-type impurities such as arsenic and phosphorus. The I-type layer does not contain impurities and is formed of so-called an intrinsic semiconductor (for example, silicon). The P-type layer is formed of a semiconductor (for example, silicon) containing P-type impurities such as boron.

The first electrode layer 12b is formed on the upper surface of the diode layer 12a. The first electrode layer 12b may be formed of a material containing titanium nitride (TiN) or tantalum nitride (TaN) as the main component, or may be formed of a material containing titanium dioxide ($TiO_2$) as the main component and doped with platinum (Pt), tungsten (W), tungsten nitride (WN), or niobium (Nb).

The variable resistance layer 12c is formed on the upper surface of the first electrode layer 12b. The variable resistance layer 12c functions as a variable resistance element. The variable resistance layer 12c may comprise a material selected from a group consisting of $ZnMn_2O_4$, NiO, HfO, $TiO_2$, $SrZrO_3$, $Pr_{0.7}Ca_{0.3}MnO_3$, $SrTi_{1-x}Nb_xO_3$, $Sm_{0.7}Ca_{0.3}MnO_3$, $GdO_x$, $Fe_3O_4$, $\gamma\text{-}Fe_2O_3$, GeSe, and $Cu_2S$, as the main component. For example, a hafnium oxide ($HfO_x$) is used in the variable resistance layer 12c.

The second electrode layer 12d is formed on the upper surface of the variable resistance layer 12c. The second electrode layer 12d may be formed of a material containing TiN or TaN as the main component, or may be formed of a material containing $TiO_2$ as the main component and doped with Pt, W, WN, or Nb.

The second conductive layer 13 includes a conductive film 13a functioning as the word line WL. The conductive film 13a is disposed on the second electrode layer 12d. The conductive film 13a may be formed of a material containing tungsten (W), titanium (Ti), tantalum (Ta), molybdenum (Mo), ruthenium (Ru), cobalt (Co), and nitrides thereof, as the main component.

The memory layer 12 may comprise an insulating material in the variable resistance layer 12c and the like. However, for example, forming is performed, and thereby the resistivity of the memory layer 12 can be set to be lower than the resistivity of the interlayer insulating film 21 (see FIG. 5A) in the memory cell array 4.

The capacitive circuit 5 illustrated in FIG. 1 may be configured as illustrated in FIG. 2B, for example. FIG. 2B is a circuit diagram illustrating the configuration of the capacitive circuit 5. The capacitive circuit 5 includes bit lines BLa-1 to BLa-5, memory lines ML-1 to ML-5, word lines WLa-1 to WLa-5, and connection lines CL-1 and CL-2.

Each bit line BLa (indicated by a dot-dash line in FIG. 2B) extends in parallel with a word line WLa (indicated by a solid line illustrated in FIG. 2B). When viewed from the Z-direction, each bit line BLa overlaps a word line WLa. The plurality of bit lines BLa-1 to BLa-5 is arranged in the interlayer insulating film 21 (see FIG. 5A). The bit lines BLa are at a predetermined pitch in the Y-direction and extend in the X-direction (row direction). FIG. 2B illustrates a case where five bit lines BLa are disposed. However, the number of bit lines BLa is not limited to that depicted in FIG. 2B.

Each word line WLa extends in parallel with a bit line BLa. When viewed from the Z-direction, each word line WLa overlaps a bit line BLa. The plurality of word lines WLa-1 to WLa-5 is arranged in the interlayer insulating film 21 (see FIG. 5A) above the bit lines BLa-1 to BLa-5. The word lines WLa are at a predetermined pitch in the Y-direction and extend in the X-direction (row direction). FIG. 2B illustrates a case where five word lines WLa are disposed. However, the number of word lines WLa is not limited to that depicted in FIG. 2B.

Each memory line ML (indicated by a dotted line in FIG. 2B) is interposed between a bit line BLa and a word line WLa. The memory line ML is in contact with the bit line BLa on a −Z-side and is in contact with the word line WLa on a +Z-side. Each memory line ML extends in parallel with a bit line BLa and a word line WLa. When viewed from the Z-direction, each memory line ML overlaps a bit line BLa and is overlapped by a word line WLa. The memory lines ML are at a predetermined pitch in the Y-direction and extend in the X-direction (row direction). FIG. 2B illustrates a case where five memory lines ML are disposed. However, the number of memory lines ML is not limited to that depicted in FIG. 2B.

The connection lines CL-1 and CL-2 (indicated by solid lines in FIG. 2B) are disposed in an XY plane and extend in a direction (Y-direction) intersecting with the primary extension direction of the word lines WLa and the bit lines BLa.

The connection line CL-1 is disposed on a +X-side of the plurality of word lines WLa-1 to WLa-5 and connects the word lines WLa-2 and WLa-4 having even numbers to each other from among the plurality of word lines WLa-1 to WLa-5. Thus, an electrode EL-1 is formed. The word line WLa-2 and the bit line BLa-2 are electrically connected to each other via the memory line ML-2, and thus the bit line BLa-2, the memory line ML-2, and the word line WLa-2 form a portion (e.g., a comb tooth) of the electrode EL-1. The word line WLa-4 and the bit line BLa-4 are connected to each other via the memory line ML-4, and thus the bit line BLa-4, the memory line ML-4, and the word line WLa-4 form a portion (e.g., a comb tooth) of the electrode EL-1. The connection line CL-1 forms a portion of the electrode EL-1 connecting the comb teeth portions to each other.

Here, the connection line CL-1 specifically connects the word lines WLa-2 and WLa-4 to each other. Alternatively, the connection line CL-1 could connect the word lines WLa-2 and WLa-4 to each other and also connect the bit lines BLa-2 and BLa-4 to each other from among the plurality of bit lines BLa-1 to BLa-5.

The connection line CL-2 is disposed on a −X-side of the plurality of word lines WLa-1 to WLa-5 and connects the word lines WLa-1, WLa-3, and WLa-5 having odd numbers to each other from among the plurality of word lines WLa-1 to WLa-5. Thus, an electrode EL-2 is formed. The word line WLa-1 and the bit line BLa-1 are electrically connected to each other via the memory line ML-1, and thus the bit line BLa-1, the memory line ML-1, and the word line WLa-1 form a portion (e.g., a comb tooth) of the electrode EL-2. The word line WLa-3 and the bit line BLa-3 are electrically connected to each other via the memory line ML-3, and thus the bit line BLa-3, the memory line ML-3, and the word line WLa-3 form a portion (e.g., a comb tooth) of the electrode EL-2. The word line WLa-5 and the bit line BLa-5 are electrically connected to each other via the memory line ML-5, and thus the bit line BLa-5 the memory line ML-5, and the word line WLa-5 form a portion (e.g., a comb tooth) of the electrode EL-2. The connection line CL-2 forms a portion of the electrode EL-2 connecting the comb teeth portions to each other.

The connection line CL-2 connects the word lines WLa-1, WLa-3, and WLa-5 having odd numbers to each other. Alternatively, the connection line CL-2 may connect the word lines WLa-1, WLa-3, and WLa-5 to each other and connect the bit lines BLa-1, BLa-3, and BLa-5 to each other from among the plurality of bit lines BLa-1 to BLa-5.

In the capacitive circuit 5 illustrated in FIG. 2B, the comb tooth-like electrode EL-1 and the comb tooth-like electrode EL-2 are respectively formed, and the electrode EL-1 and the electrode EL-2 are disposed so that the teeth of one comb are between the teeth of the other via the interlayer insulating film 21 (see FIG. 5A) in the XY directions. That is, the electrode EL-1 and the electrode EL-2 constitute a MOM structure in which two sets of comb-shaped wiring patterns are formed in an interlocking manner.

Figure 4:
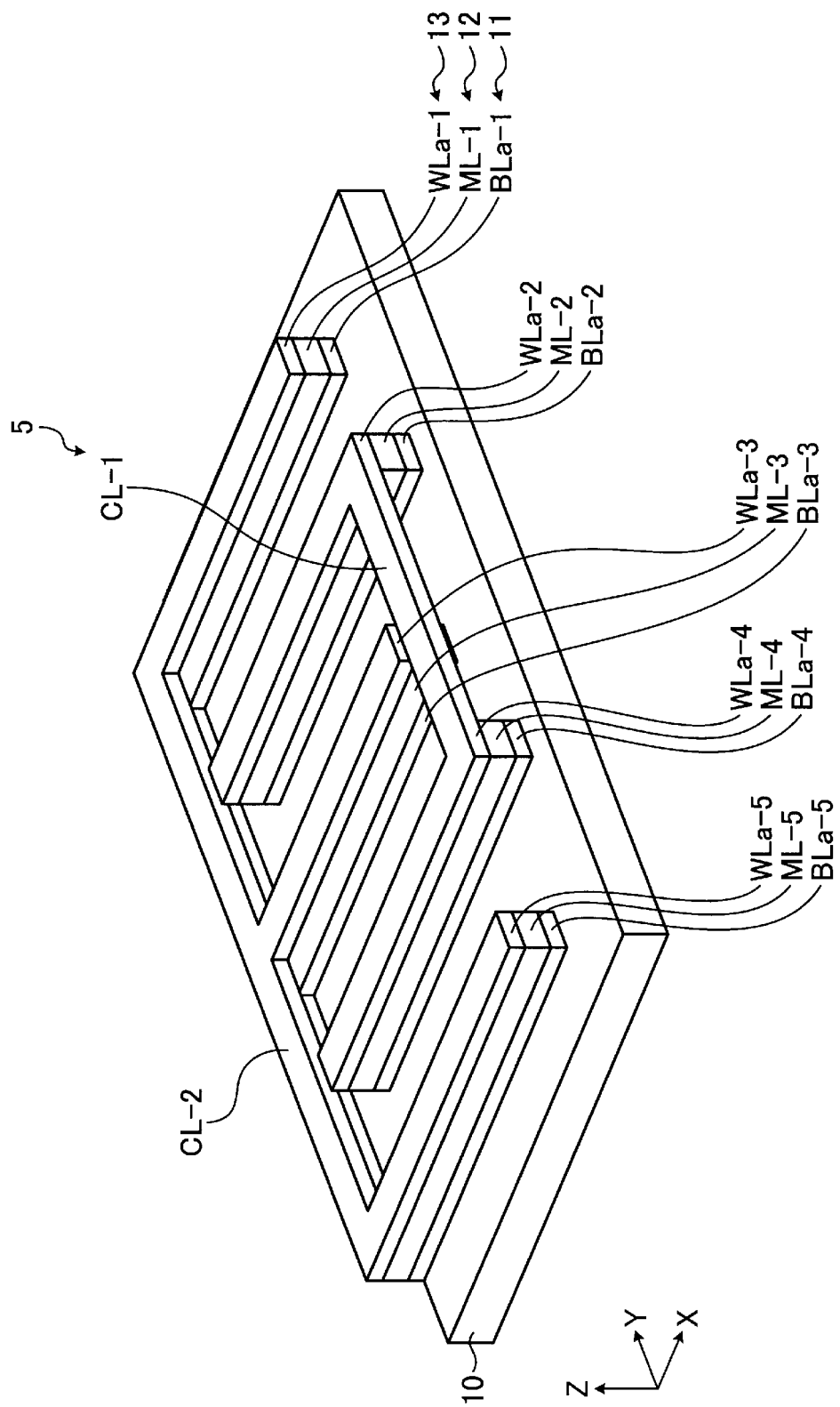
FIG. 4 depicts aspects of a capacitive circuit in a first embodiment.

A circuit configuration illustrated in FIG. 2B may be formed in a manner as illustrated in FIG. 4, for example. FIG. 4 is a perspective view illustrating a configuration of a capacitive circuit 5.

In the capacitive circuit 5, a first conductive layer 11, a memory layer 12, and a second conductive layer 13 are stacked in this order from the lower layer to the upper layer. The first conductive layer 11, the memory layer 12, and the second conductive layer 13 are layers which match the first conductive layer 11, the memory layer 12, and the second conductive layer 13 in the memory cell array 4, respectively.

The first conductive layer 11 includes bit lines BLa-1 to BLa-5. The memory layer 12 includes memory lines ML-1 to ML-5. The second conductive layer 13 includes word lines WLa-1 to WLa-5 and connection lines CL-1 and CL-2. Each bit line BLa, each memory line ML, and each word line WLa extend in the X-direction. The connection line CL-1 connects the even-numbered word lines WLa-2 and WLa-4 to each other on the +X-side. The connection line CL-2 connects the odd-numbered word lines WLa-1, WLa-3, and WLa-5 to each other on the −X-side. In this manner, a MOM structure type capacitive circuit 5 is formed.

Figure 5B:
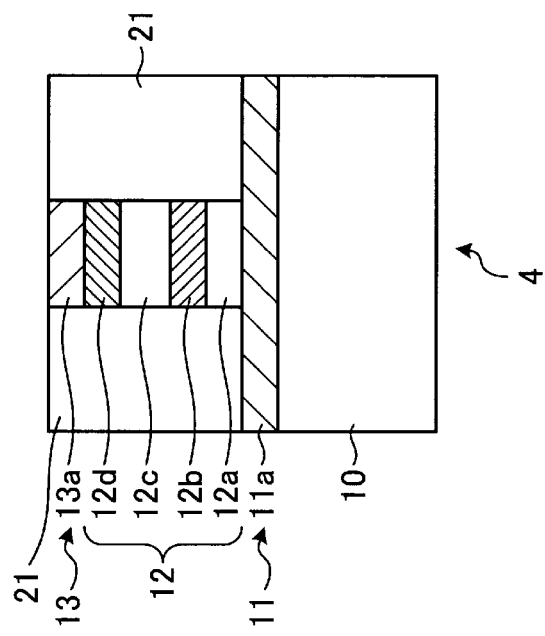

FIG. 5B is a cross-sectional view illustrating the layer configuration of the capacitive circuit 5.

The first conductive layer 11 includes a conductive film 11$a$1 functioning as a bit line BLa. The conductive film 11$a$1 is disposed on a substrate 10. The substrate 10 may be formed of a material containing a semiconductor such as silicon, as the main component. Another film (for example, an interlayer insulating film) may be disposed between the substrate 10 and the conductive film 11$a$1. The conductive film 11$a$1 may be formed of a material containing tungsten (W), titanium (Ti), tantalum (Ta), molybdenum (Mo), ruthenium (Ru), cobalt (Co), and nitrides thereof, as the main component. The conductive film 11$a$1 corresponds to the conductive film 11$a$ (see FIG. 5A) in the memory cell array 4.

The memory layer 12 includes a diode layer 12$a$1, a first electrode layer 12$b$1, a variable resistance layer 12$c$1, and a second electrode layer 12$d$1 from the lower layer to the upper layer.

The diode layer 12$a$1 is formed on the upper surface of the conductive film 11$a$1. The diode layer 12$a$1 is formed to have a metal-insulator-metal (MIM) structure or a P+ poly-silicon-intrinsic-N+ poly-silicon (PIN) structure, for example. In a case of a PIN structure, the diode layer 12$a$1 has a configuration, for example, in which an N-type layer, an I-type layer, and a P-type layer are stacked. The N-type layer is formed of a semiconductor (for example, silicon) containing N-type impurities such as arsenic and phosphorus. The I-type layer does not contain impurities and is formed of so-called an intrinsic semiconductor (for example, silicon). The P-type layer is formed of a semiconductor (for example, silicon) containing P-type impurities such as boron. The diode layer 12$a$1 corresponds to the diode layer 12$a$ (see FIG. 5A) in the memory cell array 4.

The first electrode layer 12$b$1 is formed on the upper surface of the diode layer 12$a$1. The first electrode layer 12$b$1 may be formed of a material containing TiN or TaN as the main component, or may be formed of a material containing $TiO_2$ as the main component and doped with Pt, W, WN, or Nb. The first electrode layer 12$b$1 corresponds to the first electrode layer 12$b$ (see FIG. 5A) in the memory cell array 4.

The variable resistance layer 12$c$1 is formed on the upper surface of the first electrode layer 12$b$1. The variable resistance layer 12$c$1 may be formed of a material comprises a material selected from the group consisting of $ZnMn_2O_4$, NiO, HfO, $TiO_2$, $SrZrO_3$, $Pr_{0.7}Ca_{0.3}MnO_3$, $SrTi_{1-x}Nb_xO_3$, $Sm_{0.7}Ca_{0.3}MnO_3$, $GdO_x$, $Fe_3O_4$, $\gamma\text{-}Fe_2O_3$, GeSe, and $Cu_2S$, as the main component. The variable resistance layer 12$c$1 may, for example, comprise a hafnium oxide ($HfO_x$). The variable resistance layer 12c1 corresponds to the variable resistance layer 12c (see FIG. 5A) in the memory cell array 4.

The second electrode layer 12d1 is formed on the upper surface of the variable resistance layer 12c1. The second electrode layer 12d1 may be formed of a material containing TiN or TaN as the main component, or may be formed of a material containing $TiO_2$ as the main component and doped with Pt, W, WN, or Nb. The second electrode layer 12d1 corresponds to the second electrode layer 12d (see FIG. 5A) in the memory cell array 4.

The second conductive layer 13 includes a conductive film 13a1 functioning as a word line WLa and a conductive film 13a2 functioning as a connection line CL. The conductive film 13a1 is disposed on the second electrode layer 12d1. The conductive films 13a1 and 13a2 may be formed of a material containing tungsten (W), titanium (Ti), tantalum (Ta), molybdenum (Mo), ruthenium (Ru), cobalt (Co), and nitrides thereof, as the main component. The conductive film 13a1 corresponds to the conductive film 13a (see FIG. 5A) in the memory cell array 4.

The memory layer 12 may comprise an insulating substance in the variable resistance layer 12c1 and the like. However, for example, forming is performed, and thereby the resistivity of the memory layer 12 can be controlled to be lower than the resistivity of the interlayer insulating film 21 in the capacitive circuit 5.

As described above, in the first embodiment, the capacitive circuit 5 in the semiconductor device 1 is configured such that a bit line BLa, a memory line ML, and a word line WLa parallel each other are laid out in accordance with a MOM structure. With such a configuration, it is possible to form the capacitive circuit 5 having high capacitance per unit area using substantially the same microfabrication process used in forming the plurality of bit lines and the plurality of word lines for the cross-point memory cell array 4. Thus, it is possible to increase the capacitance of the capacitive circuit 5 and to reduce the circuit area of the capacitive circuit 5.

In the first embodiment, the memory cell array 4 and the capacitive circuit 5 face each other. Thus, it is possible to form the memory cell array 4 and the capacitive circuit 5 with the same fabrication steps. Accordingly, it is possible to achieve both reduction in the cost of the semiconductor device 1 and an increase in the density of the capacitive circuit 5.

The memory cell array 4 may be a cross-point type memory cell array, but embodiments of the present disclosure are not limited to a memory cell array 4 for a resistive switching memory (ReRAM) type. For example, the memory cell array 4 may be for a phase-change memory (PCM) type, and a phase-change layer may be provided in the layer configurations illustrated in FIGS. 5A and 5B, instead of the variable resistance layers 12c and 12c1. The phase-change layer may be formed of a chalcogenide-based material, such as one of germanium (Ge), antimony (Sb), or tellurium (Te), for example. Alternatively, the memory cell array 4 is a magnetoresistive memory (MRAM) type and a magnetic layer may be provided in the layer configurations illustrated in FIGS. 5A and 5B instead of the variable resistance layers 12c and 12c1. Alternatively, the memory cell array 4 is a ferroelectric memory (FeRAM) type, and a ferroelectric layer may be provided in the layer configurations illustrated in FIGS. 5A and 5B instead of the variable resistance layers 12c and 12c1.

In the layer configuration of the capacitive circuit 5, a portion of the layer configuration of the memory cell array 4 can be omitted or changed. For example, when the diode layer 12a in the memory cell array 4 has a P+poly-silicon-intrinsic-N+poly-silicon (PIN) structure, the diode layer 12a1 in the capacitive circuit 5 may have a configuration in which the I-type layer is omitted, and only the N-type layer and the P-type layer are stacked. Likewise, the thickness of the variable resistance layer 12c1 in the capacitive circuit 5 may be thinner than the thickness of the variable resistance layer 12c in the memory cell array 4.

The rectifying element used for a memory cell structure may be, for example, a switching element between two terminals, instead of the rectifying element such as a diode. When a voltage applied between two terminals is equal to or higher than a threshold voltage, the switching element is in a "high resistance" state, for example, in an electrically non-conductive state. When the voltage applied between the two terminals is lower than the threshold voltage, the switching element changes to "a low resistance state", for example, an electrically conductive state. The switching element may have such a function regardless of the polarity of the voltage. The switching element contains one or more chalcogen elements selected from the group consisting of tellurium (Te), selenium (Se), and sulfur (S). The switching element may contain a chalcogenide which is a compound containing a chalcogen element. In addition, the switching element may contain one or more elements selected from the group consisting of B, Al, Ga, In, C, Si, Ge, Sn, As, P, and Sb.

Second Embodiment

A semiconductor device 1i according to a second embodiment will be described. Descriptions will be made below focusing on differences from the first embodiment.

In the first embodiment, a case where the memory cells were arranged in two dimensions was described as an example. In the second embodiment, a case where the memory cells are arranged in three dimensions will be described.

Specifically, the semiconductor device 1i includes a memory cell array 4i and a capacitive circuit 5i instead of the memory cell array 4 and the capacitive circuit 5.

Figure 6B:
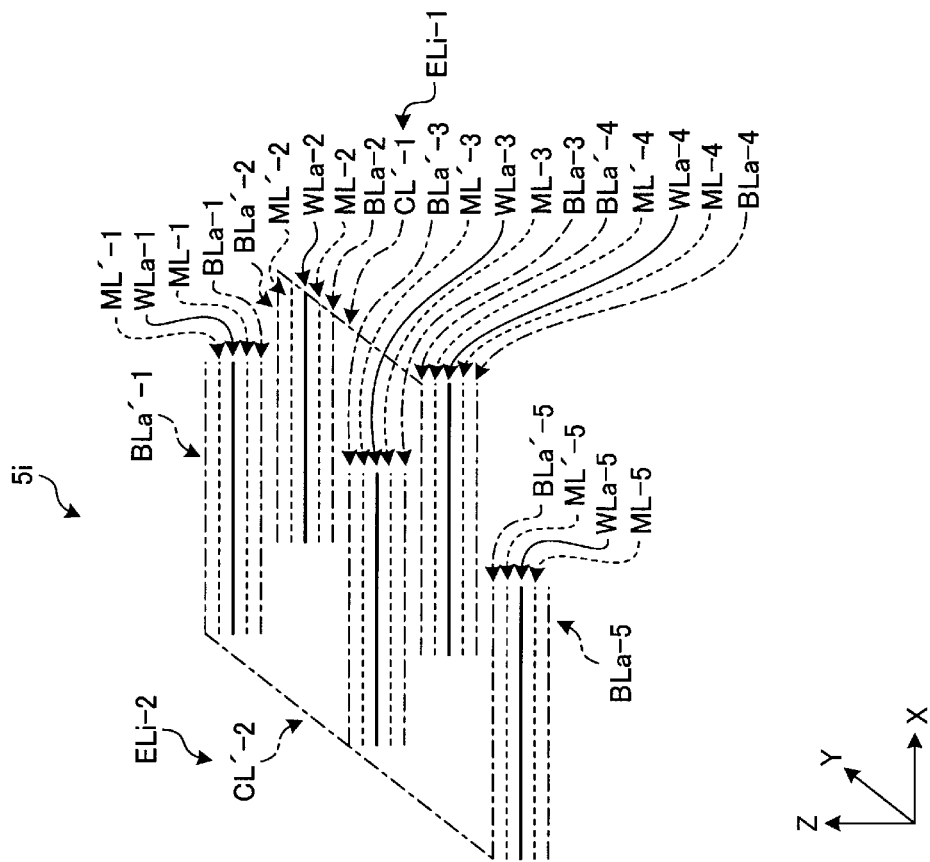
FIGS. 6A and 6B are circuit diagrams illustrating configurations of a memory cell array and a capacitive circuit according to a second embodiment.
Figure 6A:
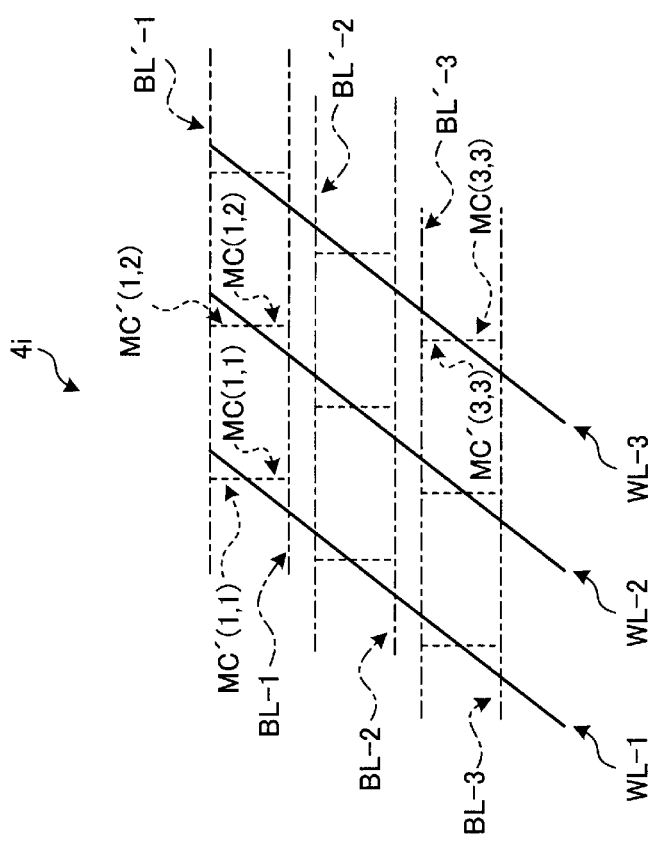

The memory cell array 4i may be configured as illustrated in FIG. 6A, for example. FIG. 6A is a circuit diagram illustrating a configuration of the memory cell array 4i. The memory cell array 4i includes memory cells MC' (1, 1) . . . MC' (3, 3) and bit lines BL'-1 to BL'-3.

The bit lines BL'-1 to BL'-3 (indicated by dot-dash lines in FIG. 6A) intersect with the word lines WL-1 to WL-3 (indicated by solid lines in FIG. 6A). The bit lines BL'-1 to BL'-3 are arranged in an interlayer insulating film 22 (see FIG. 9A), above the word lines WL-1 to WL-3. The bit lines BL' are at a predetermined pitch in the Y-direction and to extend in the X-direction. FIG. 6A illustrates a case where three bit lines BL' are disposed. However, the number of bit lines BL' is not limited to that depicted in FIG. 6A.

The plurality of memory cells MC' (1, 1) to MC' (3, 3) (indicated by dotted lines in FIG. 6A) are the intersection positions of the bit lines BL'-1 to BL'-3 and the word lines WL-1 to WL-3. The plurality of memory cells MC' (1, 1) to MC' (3, 3) is arranged in a matrix in a plane formed in the X-direction and the Y-direction. FIG. 6A illustrates a case where the memory cells MC' are arranged in 3 rows and 3 columns. However, the arrangement of the memory cell MC' is not limited to that depicted in FIG. 6A.

The plurality of memory cells MC' (1, 1) to MC'(3, 3) corresponds to the plurality of memory cells MC(1, 1) to MC(3, 3) described in conjunction with the first embodiment. Each memory cell MC' shares a word line WL with a corresponding memory cell MC.

Figure 7:
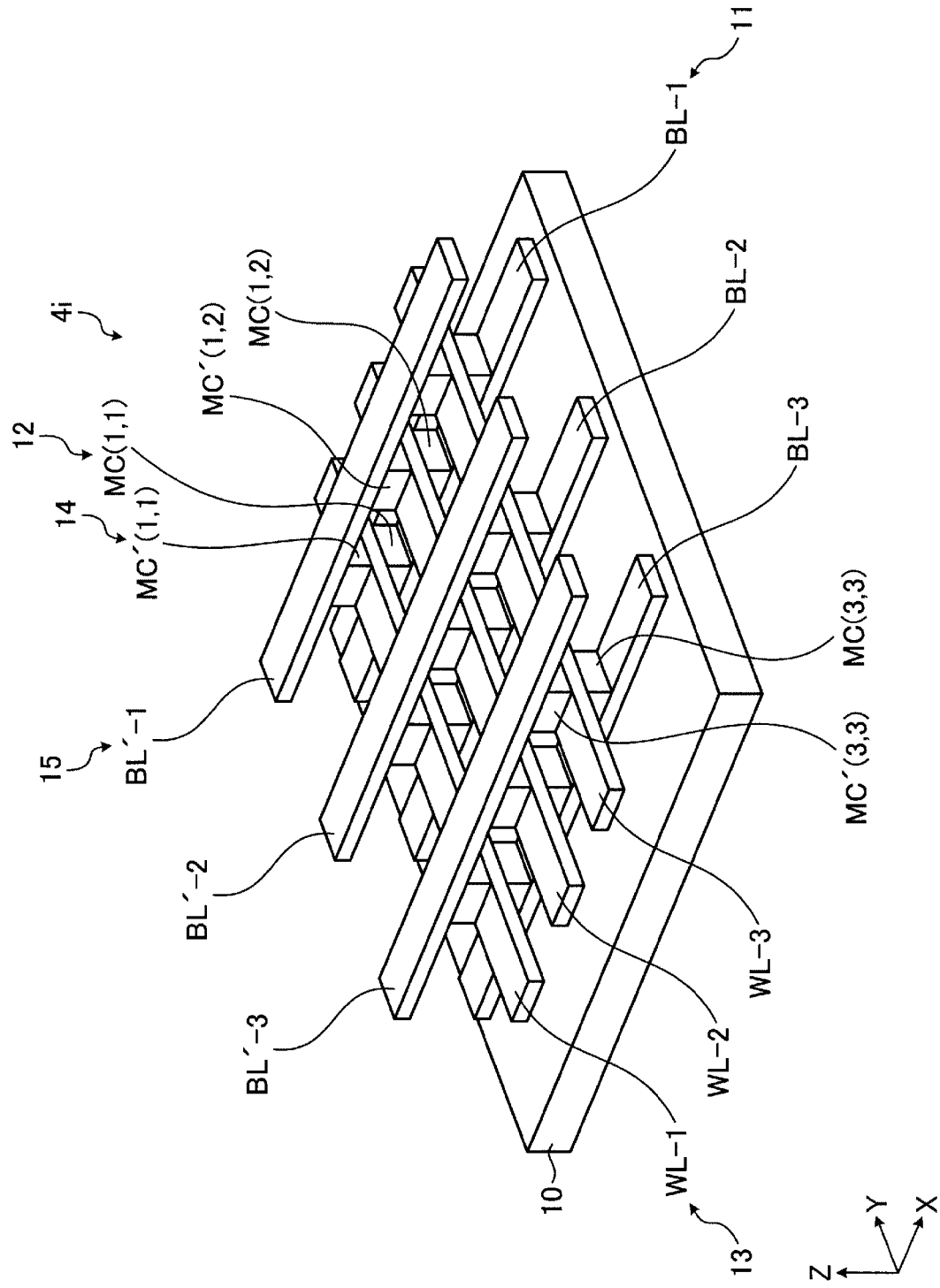
FIG. 7 depicts aspects of a memory cell array in a second embodiment.

A circuit configuration illustrated in FIG. 6A may be provided as illustrated in FIG. 7, for example. FIG. 7 is a perspective view illustrating a configuration of the memory cell array 4i.

In the memory cell array 4i, a second memory layer 14 and a third conductive layer 15 are further stacked on the layers depicted in FIG. 3. The second memory layer 14 includes the memory cells MC' (1, 1) to MC' (3, 3). The third conductive layer 15 includes the bit lines BL'-1 to BL'-3. The three-dimensional cross-point type memory cell array 4i is configured in a manner that each of the bit lines BL and BL' extends in the X-direction, each of the word lines WL extends in the Y-direction, each of the memory cells MC is disposed between the corresponding bit line BL and the corresponding word line WL in the Z-direction, and each of the memory cells MC' is disposed between the corresponding bit line BL' and the corresponding word line WL in the Z-direction.

Figure 9A:
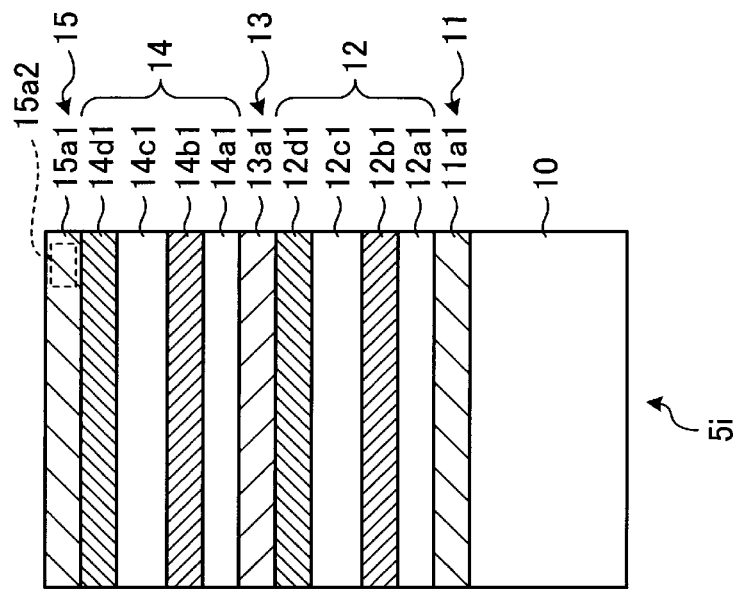
FIGS. 9A and 9B are cross-sectional views depicting aspects of a memory cell array and a capacitive circuit in a second embodiment.

FIG. 9A is a cross-sectional view illustrating the layer configuration of the memory cell array 4i.

The second memory layer 14 includes a diode layer 14a, a first electrode layer 14b, a variable resistance layer 14c, and a second electrode layer 14d from the lower layer to the upper layer.

The diode layer 14a is formed on the upper surface of the conductive film 11a. The diode layer 14a functions as a diode. The diode layer 14a is formed to have a metal-insulator-metal (MIM) structure or a P+ poly-silicon-intrinsic-N+ poly-silicon (PIN) structure, for example. In a case of the PIN structure, the diode layer 14a has a configuration, for example, in which an N-type layer, an I-type layer, and a P-type layer are stacked. The N-type layer is formed of a semiconductor (for example, silicon) containing N-type impurities such as arsenic and phosphorus. The I-type layer does not contain impurities and is formed of so-called an intrinsic semiconductor (for example, silicon). The P-type layer is formed of a semiconductor (for example, silicon) containing P-type impurities such as boron.

The first electrode layer 14b is formed on the upper surface of the diode layer 14a. The first electrode layer 14b may be formed of a material containing TiN or TaN as the main component, or may be formed of a material containing $TiO_2$ as the main component and doped with Pt, W, WN, or Nb.

The variable resistance layer 14c is formed on the upper surface of the first electrode layer 14b. The variable resistance layer 14c functions as a variable resistance element. The variable resistance layer 14c may be formed of a material comprising material selected from the group consisting of $ZnMn_2O_4$, NiO, HfO, $TiO_2$, $SrZrO_3$, $Pr_{0.7}Ca_{0.3}MnO_3$, $SrTi_{1-x}Nb_xO_3$, $Sm_{0.7}Ca_{0.3}MnO_3$, $GdO_x$, $Fe_3O_4$, $\gamma\text{-}Fe_2O_3$, GeSe, and $Cu_2S$, as the main component. For example, a hafnium oxide ($HfO_x$) is used in the variable resistance layer 14c.

The second electrode layer 14d is formed on the upper surface of the variable resistance layer 14c. The second electrode layer 14d may be formed of a material containing TiN or TaN as the main component, or may be formed of a material containing $TiO_2$ as the main component and doped with Pt, W, WN, or Nb.

The third conductive layer 15 includes a conductive film 15a functioning as the bit line BL'. The conductive film 15a is disposed on the second electrode layer 14d. The conductive film 15a may be formed of a material containing tungsten (W), titanium (Ti), tantalum (Ta), molybdenum (Mo), ruthenium (Ru), cobalt (Co), and nitrides thereof, as the main component.

The second memory layer 14 may comprise an insulating substance in the variable resistance layer 14c and the like. However, for example, forming is performed, and thereby the resistivity of the second memory layer 14 can be controlled to be lower than the resistivity of the interlayer insulating film 22 (see FIG. 9A) in the memory cell array 4i.

The capacitive circuit 5i may be configured as illustrated in FIG. 6B, for example. FIG. 6B is a circuit diagram illustrating a configuration of the capacitive circuit 5i. The capacitive circuit 5i includes connection lines CL'-1 and CL'-2 instead of the connection lines CL-1 and CL-2 (see FIG. 2B) and further includes memory lines ML'-1 to ML'-5 and bit lines BLa'-1 to BLa'-5.

Each bit line BLa' (indicated by a dot-dash line in FIG. 6B) extends in parallel with a word line WLa (indicated by a solid line illustrated in FIG. 6B). When viewed from the Z-direction, each bit line BLa' overlaps a word line WLa. The bit lines BLa'-1 to BLa'-5 are arranged in the interlayer insulating film 22 (see FIG. 9A). The bit lines BLa' are at a predetermined pitch in the Y-direction and extend in the X-direction (row direction). FIG. 6B illustrates a case where five bit lines BLa' are disposed. However, the number of bit lines BLa' is not limited to that depicted in FIG. 6B.

Each memory line ML' (indicated by a dotted line in FIG. 6B) is interposed between a word line WLa and a bit line BLa'. The memory line ML' is in contact with the word line WLa on the −Z-side and is in contact with the bit line BLa' on the +Z-side. Each memory line ML' extends in parallel with a bit line BLa' and a word line WLa. When viewed from the Z-direction, each memory line ML' overlaps a bit line BLa' and a word line WLa overlaps the memory line ML'. The memory lines ML' are at a predetermined pitch in the Y-direction and extend in the X-direction (row direction). FIG. 6B illustrates a case where five memory lines ML' are disposed. However, the number of memory lines ML' is not limited to that depicted in FIG. 6B.

The connection lines CL'-1 and CL'-2 (indicated by solid lines in FIG. 6B) are disposed along the XY plane and extend in a direction (Y-direction) intersecting with the word line WLa and the bit lines BLa and BLa'.

The connection line CL'-1 is disposed on the +X-side of the plurality of bit lines BLa'-1 to BLa'-5 and connects the even-numbered bit lines BLa'-2 and BLa'-4 to each other from among the plurality of bit lines BLa'-1 to BLa'-5. Thus, an electrode ELi-1 may be formed. That is, the bit line BLa-2, the memory line ML-2, the word line WLa-2, the memory line ML'-2, and the bit line BLa'-2 form a portion of an electrode ELi-1. The bit line BLa-4, the memory line ML-4, the word line WLa-4, the memory line ML'-4, and the bit line BLa'-4 form another portion of the electrode ELi-1. The connection line CL'-1 forms a portion of the electrode ELi-1 connecting the other portions.

The connection line CL'-1 connects the even-numbered bit lines BLa'-2 and BLa'-4 to each other. Alternatively, the connection line CL'-1 may connect the even number word lines WLa-2 and WLa-4 to each other.

The connection line CL'-2 is disposed on the −X-side of the plurality of bit lines BLa'-1 to BLa'-5 and connects the bit lines BLa'-1, BLa'-3, and BLa'-5 each other from among the plurality of bit lines BLa'-1 to BLa'-5. Thus, an electrode ELi-2 may be formed. That is, the bit line BLa-1, the memory line ML-1, the word line WLa-1, the memory line ML'-1, and the bit line BLa'-1 form a portion of the electrode ELi-2. The bit line BLa-3, the memory line ML-3, the word line WLa-3, the memory line ML'-3, and the bit line BLa'-3 from another portion of the electrode ELi-2. The bit line BLa-5, the memory line ML-5, the word line WLa-5, the memory line ML'-5, and the bit line BLa'-5 form another portion of the electrode ELi-2. The connection line CL'-2 forms a portion of the electrode ELi-2 connecting the other portions.

The connection line CL'-2 connects the odd-numbered bit lines BLa'-1, BLa'-3, and BLa'-5 to each other. Alternatively, the connection line CL'-2 may the odd-numbered word lines WLa-1, WLa-3, and WLa-5 to each other.

In the capacitive circuit $5i$ illustrated in FIG. 6B, the comb tooth-like electrode ELi-1 and the comb tooth-like electrode ELi-2 are respectively formed, and the electrode ELi-1 and the electrode ELi-2 are disposed so that the teeth of one comb interdigitate with the teeth of the other while being spaced from each other via the interlayer insulating film 21 and the interlayer insulating film 22 (see FIG. 9A) in the XY directions. That is, the electrode ELi-1 and the electrode ELi-2 form a MOM structure.

Figure 8:
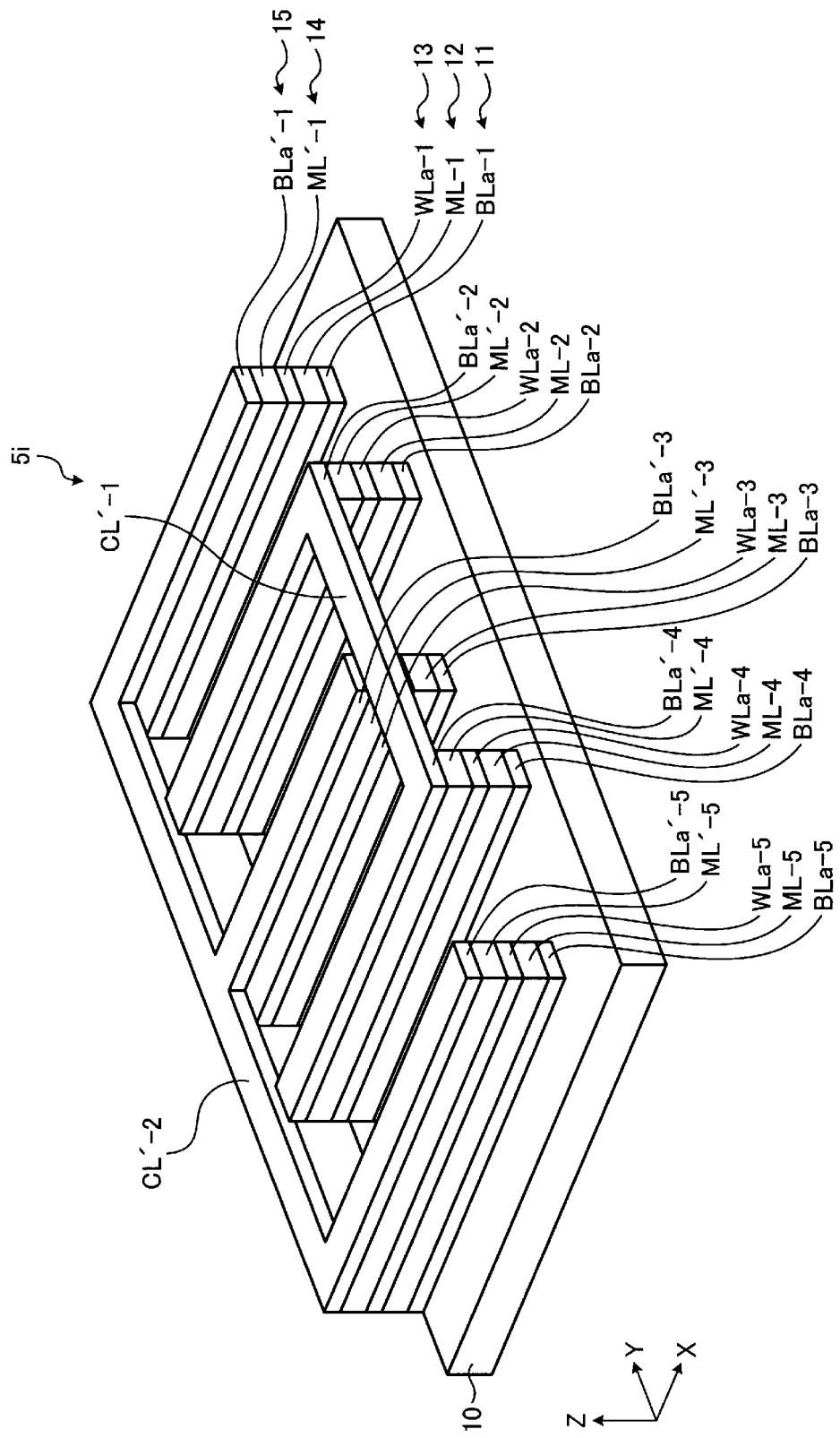
FIG. 8 depicts aspects of a capacitive circuit in a second embodiment.

A circuit configuration illustrated in FIG. 6B may be formed as illustrated in FIG. 8, for example. FIG. 8 is a perspective view illustrating a configuration of mounting the capacitive circuit $5i$.

In the capacitive circuit $5i$, a second memory layer 14 and a third conductive layer 15 are further stacked. The second memory layer 14 and the third conductive layer 15 are layers which are also used as the second memory layer 14 and the third conductive layer 15 in the memory cell array $4i$, respectively.

The second memory layer 14 includes memory lines ML'-1 to ML'-5. A third conductive layer 15 includes bit lines BLa'-1 to BLa'-5 and connection lines CL'-1 and CL'-2. Each of the bit lines BLa and BLa', each of the memory lines ML and ML', and each of the word lines WLa extend in the X-direction. The connection line CL'-1 connects the bit lines BLa'-2 and BLa'-4 to each other on the +X-side. The connection line CL'-2 connects the bit lines BLa'-1, BLa'-3, and BLa'-5 to each other on the −X-side. In this manner, the MOM structure type capacitive circuit $5i$ is formed.

Figure 9B:
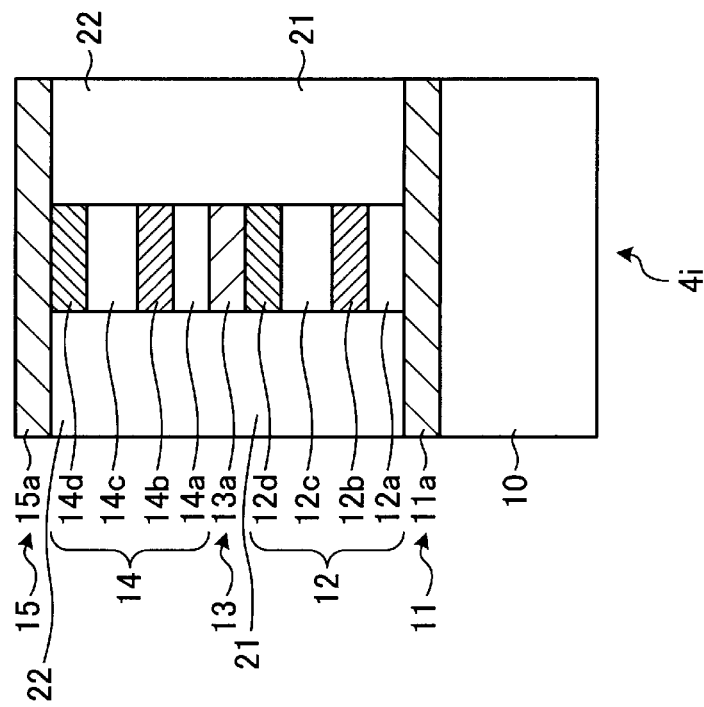

FIG. 9B is a cross-sectional view illustrating the layer configuration of the capacitive circuit $5i$.

The second memory layer 14 includes a diode layer $14a1$, a first electrode layer $14b1$, a variable resistance layer $14c1$, and a second electrode layer $14d1$ from the lower layer to the upper layer.

The diode layer $14a1$ is formed on the upper surface of the conductive film $13a1$. The diode layer $14a1$ functions as a diode. The diode layer $14a1$ is formed to have a metal-insulator-metal (MIM) structure or a P+ poly-silicon-intrinsic-N+ poly-silicon (PIN) structure, for example. In a case of the PIN structure, the diode layer $14a1$ has a configuration, for example, in which an N-type layer, an I-type layer, and a P-type layer are stacked. The N-type layer is formed of a semiconductor (for example, silicon) containing N-type impurities such as arsenic and phosphorus. The I-type layer does not contain impurities and is formed of so-called an intrinsic semiconductor (for example, silicon). The P-type layer is formed of a semiconductor (for example, silicon) containing P-type impurities such as boron. The diode layer $14a1$ corresponds to the diode layer $14a$ (see FIG. 9A) in the memory cell array $4i$.

The first electrode layer $14b1$ is formed on the upper surface of the diode layer $14a1$. The first electrode layer $14b1$ may be formed of a material containing TiN or TaN as the main component, or may be formed of a material containing $TiO_2$ as the main component and doped with Pt, W, WN, or Nb. The first electrode layer $14b1$ corresponds to the first electrode layer $14b$ (see FIG. 9A) in the memory cell array $4i$.

The variable resistance layer $14c1$ is formed on the upper surface of the first electrode layer $14b1$. The variable resistance layer $14c1$ functions as a variable resistance element. The variable resistance layer $14c1$ may be formed of a material comprising a material selected from the group consisting of $ZnMn_2O_4$, NiO, HfO, $TiO_2$, $SrZrO_3$, $Pr_{0.7}Ca_{0.3}MnO_3$, $SrTi_{1-x}Nb_xO_3$, $Sm_{0.7}Ca_{0.3}MnO_3$, $GdO_x$, $Fe_3O_4$, $\gamma\text{-}Fe_2O_3$, GeSe, and $Cu_2S$, as the main component. For example, a hafnium oxide ($HfO_x$) may be used in the variable resistance layer $14c1$. The variable resistance layer $14c1$ corresponds to the variable resistance layer $14c$ (see FIG. 9A) in the memory cell array $4i$.

The second electrode layer $14d1$ is formed on the upper surface of the variable resistance layer $14c1$. The second electrode layer $14d1$ may be formed of a material containing TiN or TaN as the main component, or may be formed of a material containing $TiO_2$ as the main component and doped with Pt, W, WN, or Nb. The second electrode layer $14d1$ corresponds to the second electrode layer $14d$ (see FIG. 9A) in the memory cell array $4i$.

The third conductive layer 15 includes a conductive film $15a1$ functioning as the bit line BL' and a conductive film $15a2$ functioning as the connection line CL'. The conductive film $15a1$ is disposed on the second electrode layer $14d1$. The conductive films $15a1$ and $15a2$ may be formed of a material containing tungsten (W), titanium (Ti), tantalum (Ta), molybdenum (Mo), ruthenium (Ru), cobalt (Co), and nitrides thereof, as the main component. The conductive film $15a1$ corresponds to the conductive film $15a$ (see FIG. 9A) in the memory cell array $4i$.

The second memory layer 14 may contain an insulating substance in the variable resistance layer $14c1$. However, for example, forming is performed, and thereby the resistivity of the second memory layer 14 can be varied to be lower than the resistivity of the interlayer insulating film 22 (see FIG. 9A) in the memory cell array $4i$.

As described above, in the second embodiment, the capacitive circuit $5i$ in the semiconductor device $1i$ is configured such that the bit line BLa, the memory line ML, the word line WLa, the memory line ML', and the bit line BLa' overlap each other, and is laid out in accordance with a MOM structure. With such a configuration, it is also possible to form the capacitive circuit $5i$ having high capacitance per unit area using the same microfabrication processes for forming the plurality of bit lines and the plurality of word lines used in fabricating the memory cell array $4i$. Thus, it is also possible to increase the density and the capacitance of the capacitive circuit $5i$ and to reduce the circuit area of the capacitive circuit $5i$ having required capacitance.

In the second embodiment, the memory cell array $4i$ and the capacitive circuit $5i$ face each other. Thus, it is possible to form the memory cell array $4i$ and the capacitive circuit $5i$ with the same manufacturing process steps. Accordingly, it is possible to achieve both reduction of the cost of the semiconductor device $1i$ and an increase of the density of the capacitive circuit $5i$.

Third Embodiment

A semiconductor device $1j$ according to a third embodiment will be described. Descriptions will be made below focusing on differences from the first embodiment and the second embodiment.

The case where the memory cells are arranged in two dimensions was described as an example in the first embodiment. A case in which an upper and a lower layer of memory cells share word lines was described as an example in the second embodiment. In the third embodiment, a case in which the upper layer and lower layer of memory cells do not share word lines (in contrast to the second embodiment) is described as an example.

Specifically, a semiconductor device 1j includes a memory cell array 4j and a capacitive circuit 5j instead of the memory cell array 4 and the capacitive circuit 5 (see FIG. 1) or the memory cell array 4i or the capacitive circuit 5i (see FIGS. 6A and 6B).

The memory cell array 4j may be configured as illustrated in FIG. 10A, for example. FIG. 10A is a circuit diagram illustrating a configuration of the memory cell array 4j. The memory cell array 4j further includes bit lines BL"-1 to BL"-3, memory cells MC"(1, 1) . . . MC"(3, 3), and word lines WL"-1 to WL"-3.

The bit lines BL"-1 to BL"-3 (indicated by dot-dash lines in FIG. 10A) intersect with the f word lines WL"-1 to WL"-3 (indicated by solid lines in FIG. 10A). The bit lines BL"-1 to BL"-3 are arranged on an interlayer insulating film 23 (see FIG. 13A) above the word lines WL-1 to WL-3. The bit lines BL"-1 to BL"-3 is arranged in an interlayer insulating film 22 (see FIG. 13A). The bit lines BL" are at a predetermined pitch in the Y-direction and extend in the X-direction. FIG. 10A illustrates a case where the three bit lines BL" are disposed. However, the number of bit lines BL" is not limited to that depicted in FIG. 13A.

The word lines WL"-1 to WL"-3 intersect the bit lines BL"-1 to BL"-3. The word lines WL"-1 to WL"-3 are arranged in the interlayer insulating film 22 (see FIG. 13A) above the plurality of bit lines BL"-1 to BL"-3. The word lines WL" are at a predetermined pitch in the X-direction and extend in the Y-direction. FIG. 10A illustrates a case where the three word lines WL" are disposed. However, the number of word lines WL" is not limited to that depicted in FIG. 10A.

The memory cells MC" (1, 1) to MC" (3, 3) (indicated by dotted lines in FIG. 10A) are at positions of intersection of bit lines BL"-1 to BL"-3 and the word lines WL"-1 to WL"-3. The plurality of memory cells MC" (1, 1) to MC" (3, 3) is arranged in a plane. FIG. 10A illustrates a case where the memory cells MC" are arranged in 3 rows and 3 columns. However, the arrangement of the memory cell MC" is not limited to that in depicted FIG. 10A.

The plurality of memory cells MC" (1, 1) to MC" (3, 3) corresponds to the plurality of memory cells MC(1, 1) to MC(3, 3); however, the word line WL" of each memory cell MC" is separate from the word line WL of the corresponding memory cell MC. Thus, each memory cell MC" is formed to be accessible with the corresponding memory cell MC while being independent from the corresponding memory cell MC.

Figure 11:
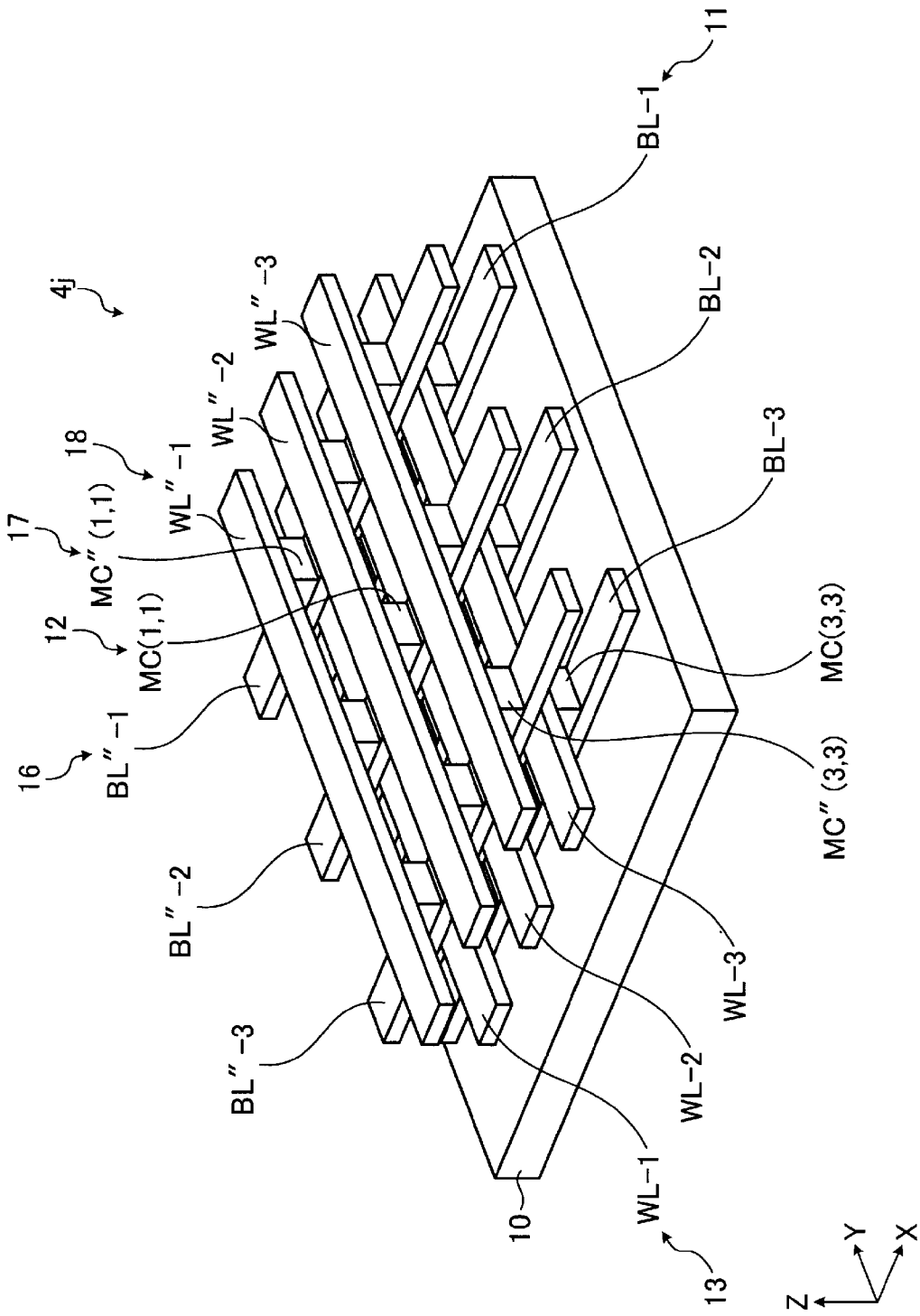
FIG. 11 depicts aspects of a memory cell array in a third embodiment.

A circuit configuration illustrated in FIG. 10A may be formed in a manner as illustrated in FIG. 11, for example. FIG. 11 is a perspective view illustrating a configuration of mounting the memory cell array 4j.

In the memory cell array 4j, a third conductive layer 16, a second memory layer 17, and a fourth conductive layer 18 are further stacked. The third conductive layer 16 includes bit lines BL"-1 to BL"-3. The second memory layer 17 includes memory cells MC" (1, 1) to MC" (3, 3). The fourth conductive layer 18 includes word lines WL"-1 to WL"-3. A three-dimensional cross-point type memory cell array 4j is configured in a manner such that each of the bit lines BL and BL' extends in the X-direction, each of the word lines WL and WL" extends in the Y-direction, each of the memory cells MC is disposed between the corresponding bit line BL and the corresponding word line WL in the Z-direction, and each of the memory cells MC" is disposed between the corresponding bit line BL" and the corresponding word line WL" in the Z-direction.

Figure 13B:
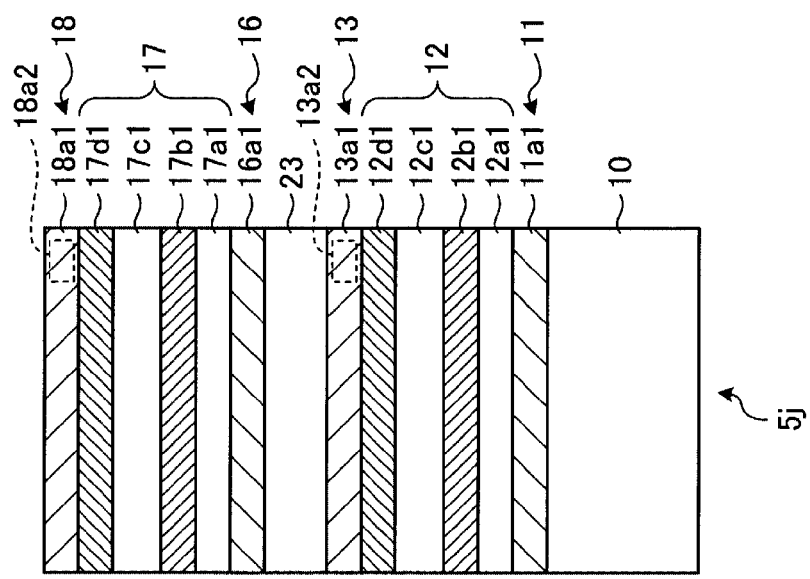
FIGS. 13A and 13B are cross-sectional views depicting aspects of a memory cell array and a capacitive circuit in a third embodiment.
Figure 13A:
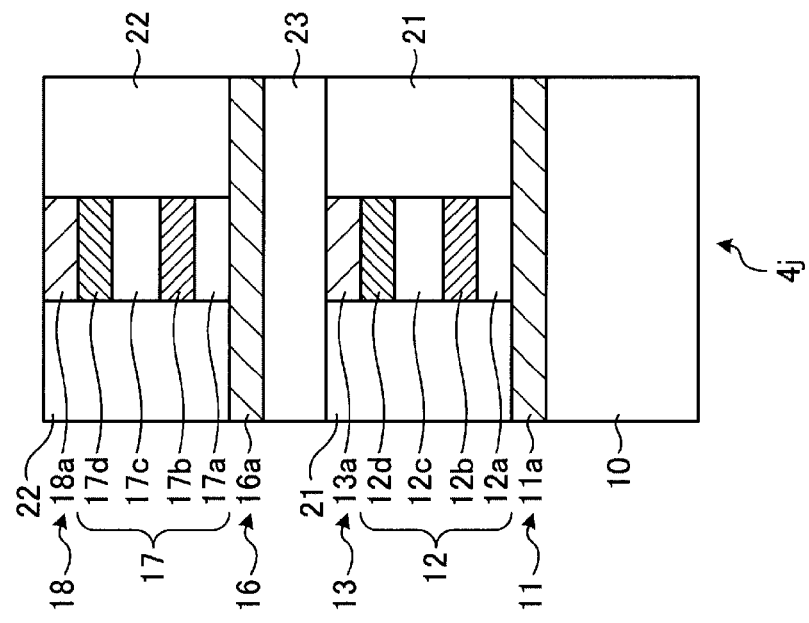

FIG. 13A is a cross-sectional view illustrating the layer configuration of the memory cell array 4j.

The third conductive layer 16 includes a conductive film 16a functioning as the bit line BL". The conductive film 16a is disposed on the substrate 10. The substrate 10 may be formed of a material containing a semiconductor such as silicon, as the main component. The conductive film 16a may be formed of a material containing tungsten (W), titanium (Ti), tantalum (Ta), molybdenum (Mo), ruthenium (Ru), cobalt (Co), and nitrides thereof, as the main component.

The second memory layer 17 includes a diode layer 17a, a first electrode layer 17b, a variable resistance layer 17c, and a second electrode layer 17d from the lower layer to the upper layer.

The diode layer 17a is formed on the upper surface of the conductive film 11a. The diode layer 17a functions as a diode. The diode layer 17a is formed to have a metal-insulator-metal (MIM) structure or a P+ poly-silicon-intrinsic-N+ poly-silicon (PIN) structure, for example. In a case of the PIN structure, the diode layer 17a has a configuration, for example, in which an N-type layer, an I-type layer, and a P-type layer are stacked. The N-type layer is formed of a semiconductor (for example, silicon) containing N-type impurities such as arsenic and phosphorus. The I-type layer does not contain impurities and is formed of so-called an intrinsic semiconductor (for example, silicon). The P-type layer is formed of a semiconductor (for example, silicon) containing P-type impurities such as boron.

The first electrode layer 17b is formed on the upper surface of the diode layer 17a. The first electrode layer 17b may be formed of a material containing TiN or TaN as the main component, or may be formed of a material containing $TiO_2$ as the main component and doped with Pt, W, WN, or Nb.

The variable resistance layer 17c is formed on the upper surface of the first electrode layer 17b. The variable resistance layer 17c functions as a variable resistance element. The variable resistance layer 17c may be formed of a material comprising a material selected from the group consisting of $ZnMn_2O_4$, NiO, HfO, $TiO_2$, $SrZrO_3$, $Pr_{0.7}Ca_{0.3}MnO_3$, $SrTi_{1-x}Nb_xO_3$, $Sm_{0.7}Ca_{0.3}MnO_3$, $GdO_x$, $Fe_3O_4$, $\gamma\text{-}Fe_2O_3$, GeSe, and $Cu_2S$, as the main component. For example, a hafnium oxide ($HfO_x$) may be utilized in variable resistance layer 17c.

The second electrode layer 17d is formed on the upper surface of the variable resistance layer 17c. The second electrode layer 17d may be formed of a material containing TiN or TaN as the main component, or may be formed of a material containing $TiO_2$ as the main component and doped with Pt, W, WN, or Nb.

The fourth conductive layer 18 includes a conductive film 18a functioning as the bit line BL". The conductive film 18a is disposed on the second electrode layer 17d. The conductive film 18a may be formed of a material containing tungsten (W), titanium (Ti), tantalum (Ta), molybdenum (Mo), ruthenium (Ru), cobalt (Co), and nitrides thereof, as the main component.

The second memory layer 17 may comprise an insulating substance in the variable resistance layer 17c. However, for example, forming is performed, and thereby the resistivity of the second memory layer 17 can be altered to be lower than the resistivity of the interlayer insulating film 22 (see FIG. 13A) in the memory cell array 4j.

The capacitive circuit 5j may be configured as illustrated in FIG. 10B, for example. FIG. 10B is a circuit diagram illustrating a configuration of the capacitive circuit 5j. The capacitive circuit 5j includes connection lines CL'-1 and CL'-2 and connection lines CL"-1 and CL"-2 and connection plugs CP-1 to CP-2 instead of the plurality of connection lines CL-1 and CL-2 (compare FIG. 2B) and further includes bit lines BLa"-1 to BLa"-5, a memory lines ML"-1 to ML"-5, and word lines WLa"-1 to WLa"-5.

Each bit line BLa" (indicated by a dot-dash line in FIG. 10B) extends in parallel with a word line WLa" (indicated by a solid line illustrated in FIG. 10B). When viewed from the Z-direction, each bit line BLa" overlaps the word line WLa". The bit lines BLa"-1 to BLa"-5 is arranged in an interlayer insulating film 22 (see FIG. 13A). The bit lines BLa" are at a predetermined pitch in the Y-direction and extend in the X-direction. FIG. 10B illustrates a case where the five bit lines BLa" are disposed. However, the number of bit lines BLa" is not limited to that depicted in FIG. 10B.

Each of the word lines WLa" extends in parallel with a bit line BLa". When viewed from the Z-direction, each word line WLa" overlaps a bit line BLa". The plurality of word lines WLa"-1 to WLa"-5 is in the interlayer insulating film 22 (see FIG. 13A) above the bit lines BLa"-1 to BLa"-5. The word lines WLa" are at a predetermined pitch in the Y-direction and extend in the X-direction. FIG. 10B illustrates a case where the five word lines WLa" are disposed. However, the number of word lines WLa" is not limited to that depicted in FIG. 10B.

Each memory line ML" (indicated by a dotted line in FIG. 10B) is interposed between the corresponding word line WLa" and the corresponding bit line BLa". The memory line ML" is in contact with the bit line BLa" on the −Z-side and is in contact with the word line WLa" on the +Z-side. Each of the memory lines ML" extends in parallel with a bit line BLa" and a word line WLa". When viewed from the Z-direction, each memory line ML" overlaps a bit line BLa" and a word line WLa" overlaps each memory line ML". The memory lines ML" are at a predetermined pitch in the Y-direction and extend in the X-direction. FIG. 10B illustrates a case where the five memory lines ML" are disposed. However, the number of memory lines ML" is not limited to that depicted in FIG. 10B.

The connection lines CL"-1 and CL"-2 (indicated by solid lines in FIG. 10B) are disposed along an XY plane and extend in a direction (Y-direction) intersecting with the word lines WLa" and the bit lines BLa". The connection plugs CP-1 and CP-2 (indicated by dotted lines in FIG. 10B) are between the connection lines CL-1 and CL-2 and the connection lines CL"-1 and CL"-2, respectively. The connection plugs CP-1 and CP-2 extend in the Z-direction. As depicted in FIG. 10B, connection plug CP-1 connects connection line CL-1 to connection line CL"-1, and connection plug CP-2 connects connection line CL-2 to connection line CL"-2.

The connection line CL"-1 is disposed on the +X-side of the plurality of word lines WLa"-1 to WLa"-5 and connects the odd-numbered word lines WLa"-1, WLa"-3, and WLa"-5 to each other from among the plurality of word lines WLa"-1 to WLa"-5. The connection plug CP-1 connects the connection line CL"-1 and the connection line CL-1 to each other. Thus, an electrode ELj-1 may be formed. That is, the bit line BLa"-1, the memory line ML"-1, and the word line WLa"-1 forms a portion of the electrode ELj-1. The bit line BLa"-3, the memory line ML"-3, and the word line WLa"-3 form another portion of the electrode ELj-1. The bit line BLa"-5, the memory line ML"-5, and the word line WLa"-5 form another portion of the electrode ELj-1. The connection line CL"-1 and the connection plug CP-1 form a portion connecting the other portions of the electrode ELj-1. The electrode EL-1 (see FIG. 2B) in the first embodiment may be a portion of the electrode ELj-1.

The connection line CL"-1 connects the word lines WLa"-1, WLa"-3, and WLa"-5 to each other. Alternatively, the connection line CL"-1 may connect the bit lines BLa"-1, BLa"-3, and BLa"-5 to each other.

The connection line CL"-2 is disposed on the −X-side of the plurality of word lines WLa"-1 to WLa"-5 and connects the word lines WLa"-2 and WLa"-4 to each other from among the plurality of word lines WLa"-1 to WLa"-5. The connection plug CP-2 connects the connection line CL"-2 and the connection line CL-2 to each other. Thus, an electrode ELj-2 may be formed. That is, the bit line BLa"-2, the memory line ML"-2, and the word line WLa"-2 form a portion of the electrode ELj-2. The bit line BLa"-4, the memory line ML"-4, and the word line WLa"-4 form another portion of the electrode ELj-2. The connection line CL"-2 and the connection plug CP-2 form a portion connection other portions of the electrode ELj-2. The electrode EL-2 (see FIG. 2B) in the first embodiment may be a portion of the electrode ELj-2.

The connection line CL"-2 connects the word lines WLa"-2 and WLa"-4 to each other. Alternatively, the connection line CL"-2 may connect the bit lines BLa"-2 and BLa"-4 to each other.

In the capacitive circuit 5j illustrated in FIG. 10B, the comb tooth-like electrodes ELj-1 and the comb tooth-like electrodes ELj-2 are respectively formed. Portions of the electrode ELj-1 on the −Z-side and portions of the electrode ELj-2 on the −Z-side are arranged so that the teeth of one comb come between the teeth of the other via the interlayer insulating film 21 (see FIG. 13A) while being spaced from each other in the XY directions, respectively. Portions of the electrode ELj-1 on the +Z-side and portions of the electrode ELj-2 on the +Z-side are arranged so that the teeth of one comb come between the teeth of the other via the interlayer insulating film 22 (see FIG. 13A) while being spaced from each other in the XY directions, respectively. Portions of the electrode ELj-1 on the −Z-side and portions of the electrode ELj-2 on the +Z-side are arranged to be spaced from each other via the interlayer insulating film 23 (see FIG. 13A) in the Z-direction, respectively. Portions of the electrode ELj-1 on the +Z-side and portions of the electrode ELj-2 on the −Z-side are arranged to be spaced from each other via the interlayer insulating film 23 (see FIG. 13A) in the Z-direction, respectively. That is, the electrode ELj-1 and the electrode ELj-2 may constitute a MIM structure in which capacitance is formed of a conductive layer, an insulating layer, and a conductive layer including two sets of MOM structures.

Figure 12:
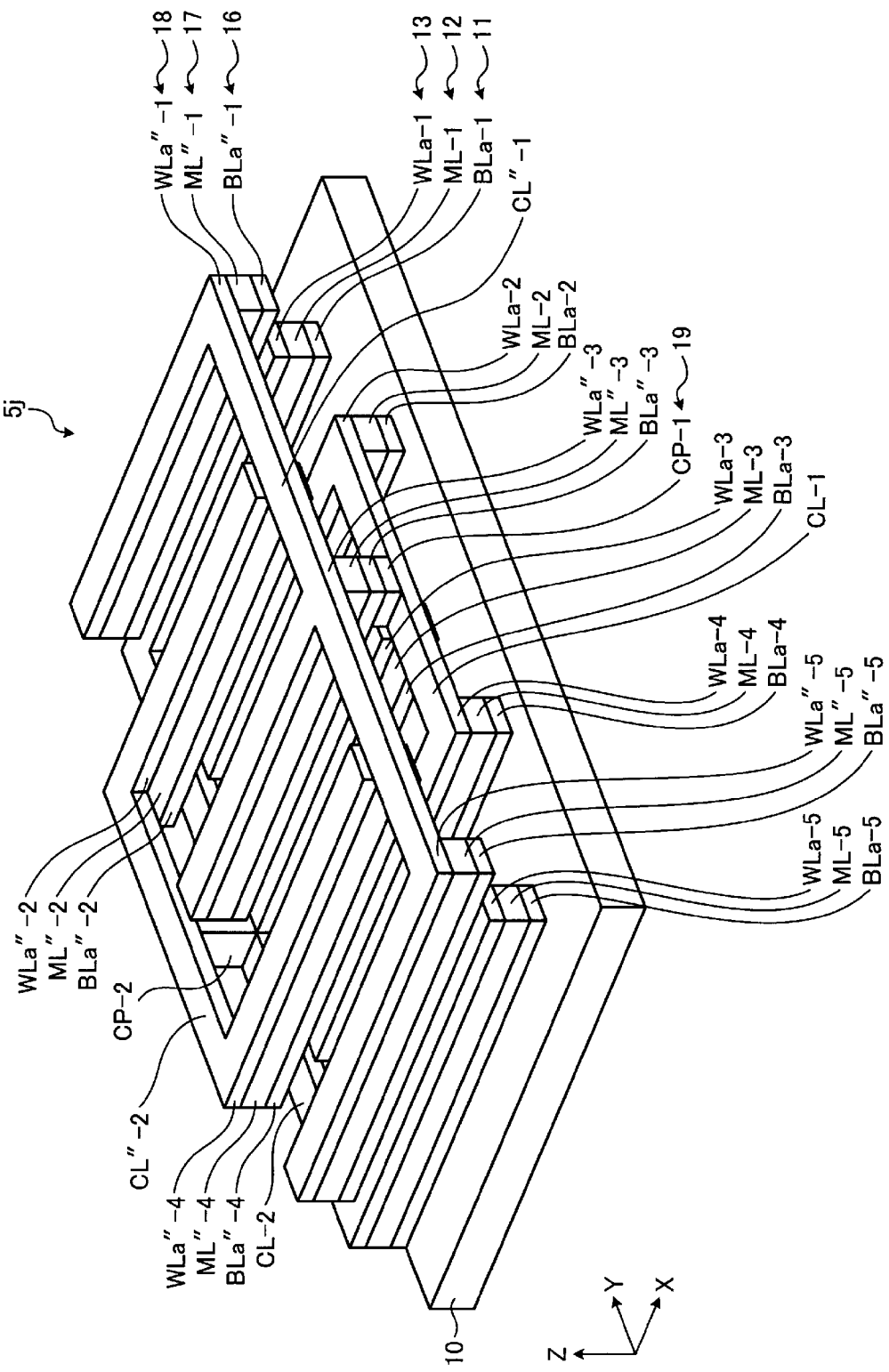
FIG. 12 depicts aspects of a capacitive circuit in a third embodiment.

A circuit configuration illustrated in FIG. 10B may be formed in a manner as illustrated in FIG. 12, for example. FIG. 12 is a perspective view illustrating a configuration of mounting the capacitive circuit 5j.

In the capacitive circuit 5j, a third conductive layer 16, a second memory layer 17, and a fourth conductive layer 18 are further stacked. A plug layer 19 is disposed between the second conductive layer 13 and the fourth conductive layer 18. The third conductive layer 16, the second memory layer 17, and the fourth conductive layer 18 are layers which are commonly used as the third conductive layer 16, the second memory layer 17, and the fourth conductive layer 18 in the memory cell array 4j, respectively.

The third conductive layer 16 includes bit lines BLa"-1 to BLa"-5. The second memory layer 17 includes memory lines ML"-1 to ML"-5. The fourth conductive layer 18 includes word lines WLa"-1 to WLa"-5 and connection lines CL"-1 and CL"-2. The plug layer 19 includes connection plugs CP-1 and connection plugs CP-2. Each of the bit lines BLa and BLa", each of the memory lines ML and ML", and each of the word lines WLa and WLa" extend in the X-direction. The connection line CL-1 connects the even numbered word lines WLa-2 and WLa-4 having to each other on the +X-side. The connection line CL-2 connects the odd-numbered word lines WLa-1, WLa-3, and WLa'-5 to each other on the −X-side. The connection line CL"-1 connects the word lines WLa"-1, WLa"-3, and WLa"-5 to each other on the +X-side. The connection line CL"-2 connects the word lines WLa"-2 and WLa"-4 to each other on the −X-side. A connection plug CP-1 connects the connection line CL-1 and the connection line CL"-1 to each other. A connection plug CP-2 connects the connection line CL-2 and the connection line CL"-2 to each other. In this manner, the capacitive circuit 5j of a MIM structure type including two sets of MOM structures is formed.

FIG. 13B is a cross-sectional view illustrating the layer configuration of the capacitive circuit 5j.

The third conductive layer 16 includes a conductive film 16a1 functioning as the bit line BLa". The conductive film 16a1 is disposed on the substrate 10. The substrate 10 may be formed of a material containing a semiconductor such as silicon, as the main component. The conductive film 16a1 may be formed of a material containing tungsten (W), titanium (Ti), tantalum (Ta), molybdenum (Mo), ruthenium (Ru), cobalt (Co), and nitrides thereof, as the main component.

The second memory layer 17 includes a diode layer 17a1, a first electrode layer 17b1, a variable resistance layer 17c1, and a second electrode layer 17d1 from the lower layer to the upper layer.

The diode layer 17a1 is formed on the upper surface of the conductive film 13a1. The diode layer 17a1 functions as a diode. The diode layer 17a1 is formed to have a metal-insulator-metal (MIM) structure or a P+ poly-silicon-intrinsic-N+ poly-silicon (PIN) structure, for example. In a case of the PIN structure, the diode layer 17a1 has a configuration, for example, in which an N-type layer, an I-type layer, and a P-type layer are stacked. The N-type layer is formed of a semiconductor (for example, silicon) containing N-type impurities such as arsenic and phosphorus. The I-type layer does not contain impurities and is formed of so-called an intrinsic semiconductor (for example, silicon). The P-type layer is formed of a semiconductor (for example, silicon) containing P-type impurities such as boron. The diode layer 17a1 corresponds to the diode layer 17a (see FIG. 13A) in the memory cell array 4j.

The first electrode layer 17b1 is formed on the upper surface of the diode layer 17a1. The first electrode layer 17b1 may be formed of a material containing TiN or TaN as the main component, or may be formed of a material containing $TiO_2$ as the main component and doped with Pt, W, WN, or Nb. The first electrode layer 17b1 corresponds to the first electrode layer 17b (see FIG. 13A) in the memory cell array 4j.

The variable resistance layer 17c1 is formed on the upper surface of the first electrode layer 17b1. The variable resistance layer 17c1 functions as a variable resistance element. The variable resistance layer 17c1 may be formed of a material comprising a material selected from a group consisting of $ZnMn_2O_4$, NiO, HfO, $TiO_2$, $SrZrO_3$, $Pr_{0.7}Ca_{0.3}MnO_3$, $SrTi_{1-x}Nb_xO_3$, $Sm_{0.7}Ca_{0.3}MnO_3$, $GdO_x$, $Fe_3O_4$, $\gamma\text{-}Fe_2O_3$, GeSe, and $Cu_2S$, as the main component. The variable resistance layer 17c1 corresponds to the variable resistance layer 17c (see FIG. 13A) in the memory cell array 4j.

The second electrode layer 17d1 is formed on the upper surface of the variable resistance layer 17c1. The second electrode layer 17d1 may be formed of a material containing TiN or TaN as the main component, or may be formed of a material containing $TiO_2$ as the main component and doped with Pt, W, WN, or Nb. The second electrode layer 17d1 corresponds to the second electrode layer 17d (see FIG. 13A) in the memory cell array 4j.

The fourth conductive layer 18 includes a conductive film 18a1 functioning as the bit line BL' and a conductive film 18a2 functioning as the connection line CL'. The conductive film 18a1 is disposed on the second electrode layer 17d1. The conductive films 18a1 and 18a2 may be formed of a material containing tungsten (W), titanium (Ti), tantalum (Ta), molybdenum (Mo), ruthenium (Ru), cobalt (Co), and nitrides thereof, as the main component. The conductive film 18a1 corresponds to the conductive film 18a (see FIG. 13A) in the memory cell array 4j.

The second memory layer 17 may contain an insulating substance in the variable resistance layer 17c1 and the like. However, for example, forming is performed, and thereby the resistivity of the second memory layer 17 can be set lower than the resistivity of the interlayer insulating film 22 (see FIG. 13A) in the memory cell array 4j.

As described above, in the third embodiment, in the capacitive circuit 5j of the semiconductor device 1j, a MOM structure is formed in a manner such that the bit line BLa, the memory line ML, and the word line WLa overlap each other in a line and a MOM structure is formed in a manner such that the bit line BLa", the memory line ML", and the word line WLa" overlap each other in a line. Together the two MOM structures thus formed constitute a MIM structure. With such a configuration, it is also possible to form the capacitive circuit 5j having high capacitance per unit area using the same microfabrication processes used for forming the plurality of bit lines and the plurality of word lines in the memory cell array 4j. Thus, it is also possible to increase the density and the capacitance of the capacitive circuit 5j and to reduce the circuit area of the capacitive circuit 5j having required capacitance.

In the third embodiment, in the semiconductor device 1j, the memory cell array 4j, and the capacitive circuit 5j face each other. Thus, it is possible to form the memory cell array 4j and the capacitive circuit 5j with the same steps. Accordingly, it is possible to easily achieve both reduction of the cost of the semiconductor device 1j and an increase of the density of the capacitive circuit 5j.

In the first to third embodiments, a mechanism for causing layout density of the pattern in the memory cell array equal that in the capacitive circuit may be adopted by causing the shape of the pattern of the memory layer in the memory cell array area to differ from that in the capacitive circuit area.

For example, layout density may be equalized by modifying the arrangement pitch (layout gap) in the capacitive circuit area. That is, as illustrated in FIGS. 14A and 14B, when the line width L2 of the memory lines ML in a capacitive circuit 5k is equal to the width L1 of the memory cells MC in a memory cell array 4k, the arrangement pitch G2 of the memory lines ML in the capacitive circuit 5k may be wider than the arrangement pitch G1 of the memory cells MC in the memory cell array 4k. FIGS. 14A and 14B are plan views illustrating configurations of the memory cell array 4k and the capacitive circuit 5k according to a first modification example applicable to the first to third embodiments. As illustrated in FIGS. 14A and 14B, in the memory cell array 4k, when the layout width of the memory cells MC in the X-direction and the layout width thereof in the Y-direction are each set as L1, and the layout gap in the X-direction and the layout gap in the Y-direction are each set as G1 (≅L1), the layout density of the memory layer 12 in the memory cells MC is about 25%. In the capacitive circuit 5k, when the layout width of the memory line ML in the Y-direction is set as L2 (≅L1), if the layout gap thereof in the Y-direction is set as G2 (≅L2×3), the layout density of the memory line ML in the memory layer 12 may be set to about 25%. That is, the layout density of the pattern of the memory layer 12 in the memory cell array 4k can be set to be equal to that in the capacitive circuit 5k.

Alternatively, for example, the layout density may be set to be equal by adjusting the line widths (layout widths). That is, in the memory layer 12, as illustrated in FIGS. 15A and 15B, when the arrangement pitch P2 of the memory line ML in a capacitive circuit 5n is equal to the arrangement pitch P1 of the memory cell MC in a memory cell array 4n, the line width L3 of the memory line ML in the capacitive circuit 5n may be less than the width L1 of the memory cell MC in the memory cell array 4n. FIGS. 15A and 15B are plan views illustrating configurations of the memory cell array 4n and the capacitive circuit 5n according to a second modification example applicable to the first to the third embodiments. As illustrated in FIGS. 15A and 15B, in the memory cell array 4n, when the layout width of the memory cell MC in the X-direction and the layout width in the Y-direction are set as L1 (≅P1×½), and the layout gap in the X-direction and the layout gap in the Y-direction are set as G1 (≅L1≅P1×½), the layout density of the memory cell MC in the memory layer 12 may be set to about 25%. In the capacitive circuit 5n, when the layout width of the memory line ML in the Y-direction is set as L3 (≅P2×¼<L1≅P1×½), if the layout gap thereof in the Y-direction is set as G3 (≅L3×3≅P2×¾), the layout density of the memory line ML in the memory layer 12 may be set to about 25%. That is, the layout density of the pattern of the memory layer 12 in the memory cell array 4n can be set to be equal to that in the capacitive circuit 5n.

Figure 16:
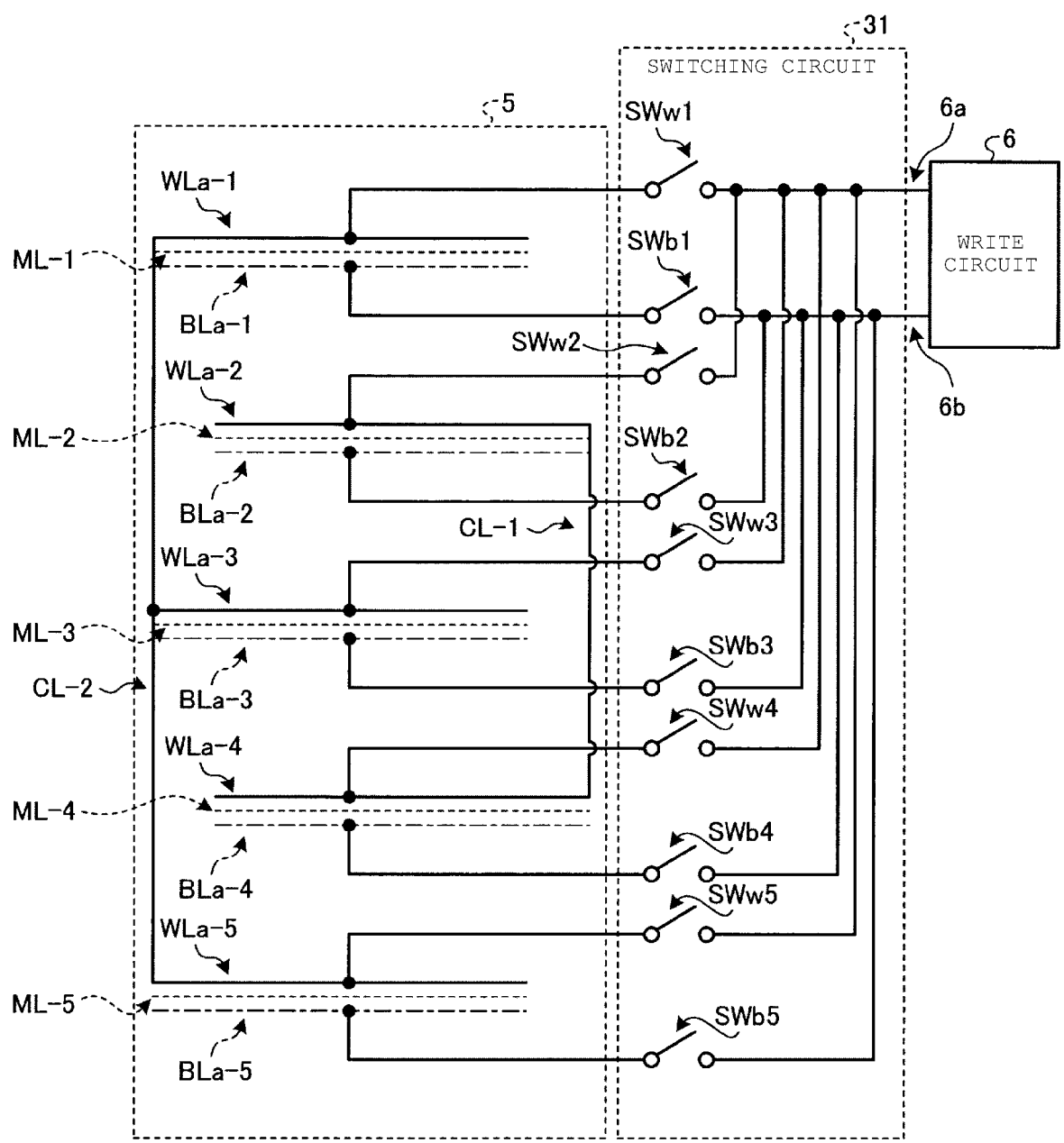
FIG. 16 is a circuit diagram illustrating a configuration for writing a low resistance state in a capacitive circuit according to a third modification example applicable to a first embodiment, a second embodiment, and a third embodiment.

In the first to third embodiments, the write circuit 6 (see FIG. 1) may be used to write/set a low resistance state in each memory line ML of the capacitive circuit 5. In such a case, as illustrated in FIG. 16, a switching circuit 31 may be provided between the capacitive circuit 5 and the write circuit 6. FIG. is a circuit diagram illustrating a configuration for writing/setting a low resistance state in memory lines ML of the capacitive circuit 5.

The switching circuit 31 is capable of switching an electrical connection configuration between the capacitive circuit 5 and the write circuit 6, in accordance with a control signal supplied by the control circuit 9 (see FIG. 1) or a control signal supplied externally. As depicted in FIG. 16, the write circuit 6 has a node 6a and a node 6b. The switching circuit 31 is capable of separately connecting each word line WLa and bit line BLa adjacent to each memory line ML via the node 6a and the node 6b to the write circuit 6.

The switching circuit 31 includes switches SWw1, SWb1, SWw2, SWb2, SWw3, SWb3, SWw4, SWb4, SWw5, and SWb5. The switch SWw1 is electrically connected between the word line WLa-1 and the node 6a. The switch SWb1 is electrically connected between the bit line BLa-1 and the node 6b. The switch SWw2 is electrically connected between the word line WLa-2 and the node 6a. The switch SWb2 is electrically connected between the bit line BLa-2 and the node 6b. The switch SWw3 is electrically connected between the word line WLa-3 and the node 6a. The switch SWb3 is electrically connected between the bit line BLa-3 and the node 6b. The switch SWw4 is electrically connected between the word line WLa-4 and the node 6a. The switch SWb4 is electrically connected between the bit line BLa-4 and the node 6b. The switch SWw5 is electrically connected between the word line WLa-5 and the node 6a. The switch SWb5 is electrically connected between the bit line BLa-5 and the node 6b.

For example, when the switches SWw1 and SWb1 in the switching circuit 31 are turned ON, the write circuit 6 applies a predetermined reset voltage across the word line WLa-1 and the bit line BLa-1, and thereby a low resistance state can be written in the memory line ML-1. When the switches SWw2 and SWb2 in the switching circuit 31 are turned ON, the write circuit 6 applies the predetermined reset voltage across the word line WLa-2 and the bit line BLa-2, and thereby a low resistance state can be written in the memory line ML-2. When the switches SWw3 and SWb3 in the switching circuit 31 are turned ON, the write circuit 6 applies the predetermined reset voltage across the word line WLa-3 and the bit line BLa-3, and thereby a low resistance state can be written in the memory line ML-3. When the switches SWw4 and SWb4 in the switching circuit 31 are turned ON, the write circuit 6 applies the predetermined reset voltage across the word line WLa-4 and the bit line BLa-4, and thereby a low resistance state can be written in the memory line ML-4. When the switches SWw5 and SWb5 in the switching circuit 31 are turned ON, the write circuit 6 applies the predetermined reset voltage across the word line WLa-5 and the bit line BLa-5, and thereby a low resistance state can be written in the memory line ML-5.

Figure 17:
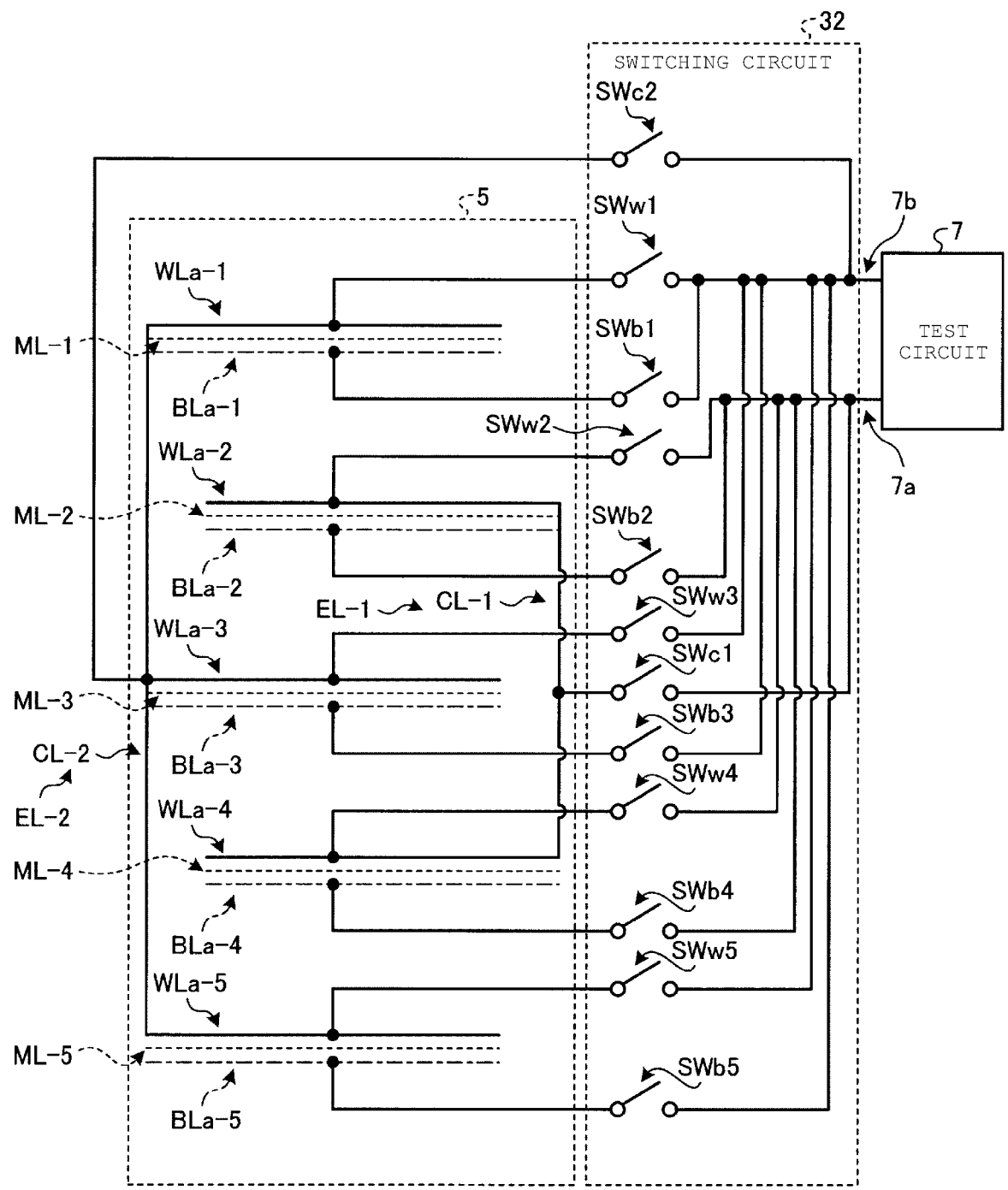
FIG. 17 is a circuit diagram illustrating a configuration for testing a capacitive circuit according to a fourth modification example applicable to a first embodiment, a second embodiment, and a third embodiment.

In the first to third embodiments, a test circuit 7 (see FIG. 1) may perform a test as to whether an insulating property is maintained between the different electrodes EL of the capacitive circuit 5 (e.g., there is a test for a short-circuit failure). In this case, for example, as illustrated in FIG. 17, a switching circuit 32 may be provided between the capacitive circuit 5 and the test circuit 7. FIG. 17 is a circuit diagram illustrating a configuration for testing the capacitive circuit 5.

The switching circuit 32 is capable of switching an electrical connection configuration between the capacitive circuit 5 and the test circuit 7, for example, in accordance with a control signal from the control circuit 9 (see FIG. 1) or a control signal supplied from the outside. The test circuit 7 has a node 7a and a node 7b. The switching circuit 32 is capable of connecting different portions of the electrodes EL-1 and EL-2 to the node 7a and the node 7b of the test circuit 7.

The timing at which the test circuit 7 and the switching circuit 32 perform a test for the capacitive circuit 5 may be before the capacitive circuit 5 is used. For example, this testing may occur after the semiconductor device is manufactured, but before the semiconductor device is used in normal operations (post-shipment operations), or the timing may be each time power is supplied to the semiconductor device (e.g., startup/initialization).

The switching circuit 32 includes switches SWw1, SWb1, SWw2, SWb2, SWw3, SWb3, SWw4, SWb4, SWw5, SWb5, SWc1, and SWc2. The switch SWw1 is electrically connected between the word line WLa-1 and the node 7b.

The switch SWb1 is electrically connected between the bit line BLa-1 and the node 7a. The switch SWw2 is electrically connected between the word line WLa-2 and the node 7b. The switch SWb2 is electrically connected between the bit line BLa-2 and the node 7a. The switch SWw3 is electrically connected between the word line WLa-3 and the node 7b. The switch SWb3 is electrically connected between the bit line BLa-3 and the node 7a. The switch SWw4 is electrically connected between the word line WLa-4 and the node 7b. The switch SWb4 is electrically connected between the bit line BLa-4 and the node 7a. The switch SWw5 is electrically connected between the word line WLa-5 and the node 7b. The switch SWb5 is electrically connected between the bit line BLa-5 and the node 7a. The switch SWc1 is electrically connected between the connection line CL-1 and the node 7a. The switch SWc2 is electrically connected between the connection line CL-2 and the node 7b.

For example, when at least one of the switches SWw2, SWb2, SWw4, SWb4, and SWc1 and at least one of the switches SWw1, SWb1, SWw3, SWb3, SWw5, SWb5, and SWc2 in the switching circuit 31 is turned ON, the test circuit 7 is capable of performing a test as to whether an electrical short circuit has formed between the electrode EL-1 and the electrode EL-2. When resistivity between the electrode EL-1 and the electrode EL-2 is equal to or lower than some threshold resistivity, the test circuit 7 can output an error signal to the control circuit 9 or otherwise. The error signal indicates that a short-circuit failure has occurred.

For example, when near patterning resolution limit manufacturing conditions for the semiconductor device are adapted from the memory cell array fabrication to the fabrication of the capacitive circuit 5, the manufacturing yield of the capacitive circuit 5 may not be high. For example, if a short-circuit failure occurs in any portion of the capacitive circuit 5, it may not be possible to use a circuit connected to the capacitive circuit 5, and thus there is a possibility that using the semiconductor device itself is not possible (faulty). In consideration of this point, the switching circuit 32, as illustrated in FIG. 17, is provided between the capacitive circuit 5 and a circuit using the capacitive circuit 5 (for example, power source circuit 8 and/or control circuit 9 illustrated in FIG. 1). Thus, in a case where it is determined by a test that a short-circuit failure occurs in the capacitive circuit 5, the switching circuit 32 can cut off an electrical connection between the capacitive circuit 5 and the circuit using the capacitive circuit 5. As a result, it is possible to avoid an occurrence in which using the entirety of the semiconductor device itself is rendered faulty by a faulty capacitive circuit 5.

Figure 18:
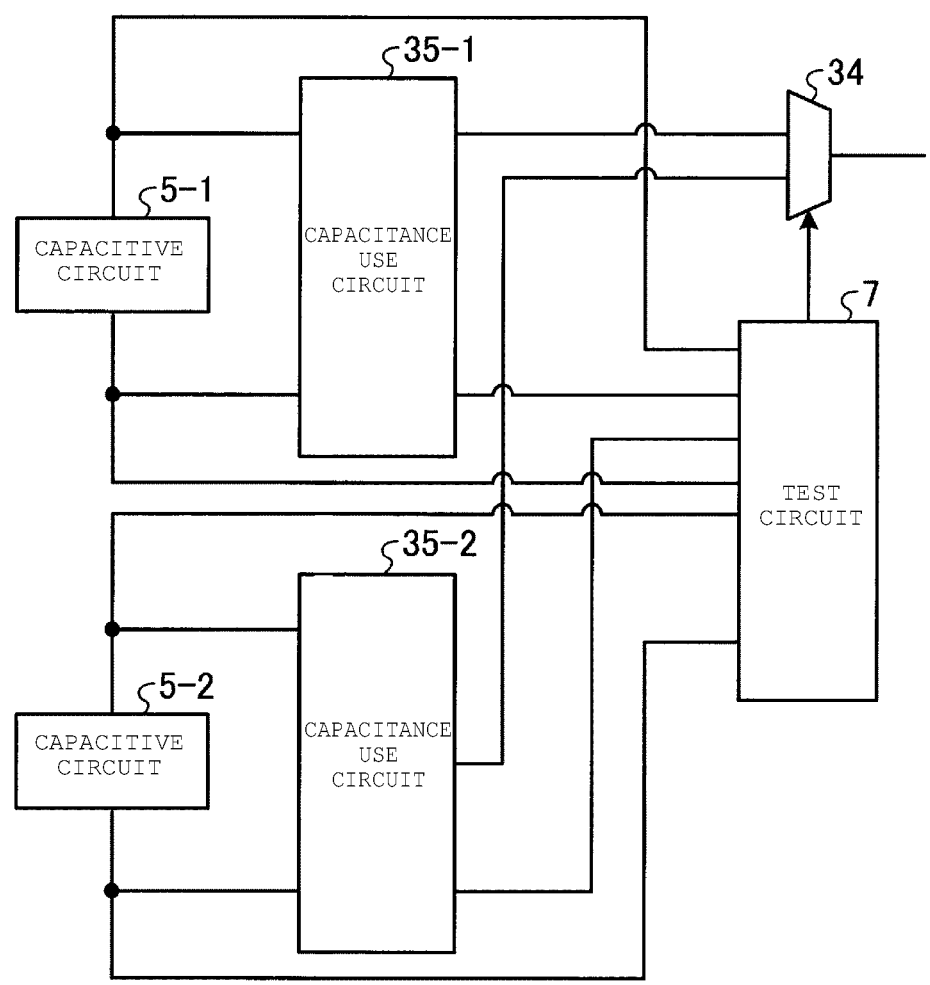
FIG. 18 is a circuit diagram illustrating a configuration including the capacitive circuit, a capacitance use circuit, and a test circuit according to a fifth modification example applicable to a first embodiment, a second embodiment, and a third embodiment.

As illustrated in FIG. 18, a capacitive circuit 5-1 and a capacitance use circuit 35-1 and a capacitive circuit 5-2 and a capacitance use circuit 35-2 may be prepared as different sets. FIG. 18 is a circuit diagram illustrating a configuration including capacitive circuits 5-1 and 5-2, capacitance use circuits 35-1 and 35-2, and test circuit 7 according to a fifth modification example applicable to the first to the third embodiments. For example, the capacitance use circuits 35-1 and 35-2 correspond to the power source circuit 8 and/or the control circuit 9 illustrated in FIG. 1. The test circuit 7 illustrated in FIG. 18 may test the capacitive circuit 5-1 and the capacitive circuit 5-2. The test circuit 7 may operate to stop operation of a faulty capacitive circuit 5 and utilize a non-faulty capacitive circuit 5. The test circuit 7 may supply a select signal to a selector 34 in accordance with a test result to select between the different capacitive circuits 5 (e.g., 5-1 and 5-2). The test circuit 7 may cause an output from the capacitance use circuit 35 connected to the non-faulty capacitive circuit 5 to be utilized.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
   a first region on a substrate;
   a second region on the substrate;
   a first wiring layer on the substrate in both the first region and the second region;
   a second wiring layer on the substrate in both the first region and the second region;
   a first memory cell layer between the first and second wiring layers in a first direction orthogonal to the substrate;
   a plurality of first conductive lines in the first wiring layer in the first region and extending in a second direction that is parallel to the substrate, the first conductive lines being spaced from each other in a third direction crossing the second direction and parallel to the substrate;
   a plurality of second conductive lines in the second wiring layer in the first region and extending in the third direction and spaced from each other in the second direction;
   a first plurality of memory cells in the first memory cell layer in the first region respectively between a first conductive line and a second conductive line at a crossing point of the first conductive line and the second conductive line;
   a plurality of third conductive lines in the first wiring layer in the second region and extending in the second direction and spaced from each other in the third direction;
   a plurality of fourth conductive lines in the second wiring layer in the second region and extending in the second direction and spaced from each other in the third direction;
   a first plurality of memory lines in the first memory cell layer in the second region respectively between a third conductive line and a fourth conductive line, the memory lines extending coextensively in the second direction with the third and fourth conductive lines, wherein
   the memory cells and the memory lines in the first memory cell layer are comprised of same materials, and
   a capacitor element is formed in the second region by the plurality of third conductive lines, the plurality of fourth conductive lines, and the first plurality of memory lines.

2. The semiconductor device according to claim 1, further comprising:
   a first connection line in the first wiring layer in the second region and extending in the third direction, ends of a first subset of the plurality of third conductive lines being connected to the first connection line; and
   a second connection line in the first wiring layer in the second region and extending in the third direction, the second connection line being spaced from the first connection line in the second direction, ends of a second subset of the plurality of third conductive lines being connected to the second connection line, wherein the capacitor element comprises an interdigitated comb structure.

3. The semiconductor device according to claim 2, further comprising:
a test circuit having a first node electrically connected to the first subset and a second node electrically connected to the second subset, the test circuit being configured to detect a short circuit failure between the first and second subsets.

4. The semiconductor device according to claim 1, wherein an electrical resistivity of each memory line is less than an electrical resistivity of an insulating film between adjacent memory lines in the first memory cell layer in the second region.

5. The semiconductor device according to claim 4, further comprising:
a write circuit having a first node selectively connectable to the plurality of third conductive lines and a second node selectively connectable to the plurality of fourth conductive lines.

6. The semiconductor device according to claim 5, wherein the electrical resistivity of each memory line is set according to a writing operation by the writing circuit that applies a write voltage across a corresponding third conductive line and a corresponding fourth conductive line.

7. The semiconductor device according to claim 1, further comprising:
a first connection line in the second wiring layer in the second region and extending in the third direction, ends of a first subset of the plurality of fourth conductive lines being connected to the first connection line; and
a second connection line in the second wiring layer in the second region and extending in the third direction, the second connection line being spaced from the first connection line in the second direction, ends of a second subset of the plurality of fourth conductive lines being connected to the second connection line, wherein
the capacitor element comprises an interdigitated comb structure.

8. The semiconductor device according to claim 1, further comprising:
a second memory cell layer on the substrate between the first and second wiring layers in the first direction;
a second plurality of memory cells in the second memory cell layer in the first region;
a second plurality of memory lines in the second memory cell layer in the second region;
a plurality of fifth conductive lines in a third wiring layer between the first and second wiring layers in the first region; and
a plurality of sixth conductive lines in the third wiring layer in the second region, wherein
the memory cells and the memory lines in the second memory cell layer are comprised of same materials.

9. The semiconductor device according to claim 8, further comprising:
an interlayer insulating film between the first and second memory cell layers in the first direction.

10. The semiconductor device according to claim 1, further comprising:
a second memory cell layer on the substrate above the first memory cell layer in the first direction;
a third wiring layer on the substrate above the second memory cell layer in the first direction;
a plurality of fifth conductive lines in the third wiring layer in the first region;
a plurality of sixth conductive lines in the third wiring layer in the second region;
a second plurality of memory cells in the second memory cell layer in the first region;
a second plurality of memory lines in the second memory cell layer in the second region, wherein
the memory cells and the memory lines in the second memory cell layer are comprised of same materials.

11. The semiconductor device according to claim 10, wherein
the fifth conductive lines extend in the second direction and are spaced from each other in the third direction,
the second plurality of memory cells are each electrically connected between a fifth conductive line and a second conductive line,
the sixth conductive lines extend in the second direction and are spaced from each other in the third direction, and
the second plurality of memory lines are electrically connected between a sixth conductive line and a fourth conductive line.

12. The semiconductor device according to claim 10, further comprising:
an interlayer insulating film between the first and second memory cell layers in the first direction.

13. The semiconductor device according to claim 1, further comprising:
an insulating material between the plurality of first conductive lines and the plurality of third conductive lines.

14. The semiconductor device according to claim 1, wherein a width of each first conductive line in the third direction is equal to a width of each third conductive line in the third direction.

15. The semiconductor device according to claim 1, wherein a spacing between adjacent first conductive lines in the third direction is different from a spacing between adjacent third conductive lines in the third direction.

16. The semiconductor device according to claim 1, further comprising:
a plurality of capacitor elements formed in the second region by the plurality of third conductive lines, the plurality of fourth conductive lines, and the first plurality of memory lines;
a test circuit configured to test the plurality of capacitor elements for short circuit failures; and
a selector configured to receive a selection signal from the test circuit and select a capacitor element from the plurality of capacitor elements without a short circuit failure.

17. A semiconductor device, comprising:
a memory region on a substrate;
a peripheral region on the substrate adjacent to the memory region;
a plurality of bit lines in a first wiring level in the memory region, the bit lines extending in a first direction and spaced from each other in a second direction;
a plurality of word lines in a second wiring level in the memory region, the word lines extending in the second direction and spaced from each other in the first direction;
a first plurality of memory cells between the first and second wiring levels in the memory region in a third direction orthogonal to the substrate, each memory cell respectively being at a crossing point of a bit line and a word line;

a plurality of first conductive lines in the first wiring level in the peripheral region, the first conductive lines extending in the first direction and spaced from each other in the second direction;

a plurality of second conductive lines in the second wiring level in the peripheral region, the second conductive lines extending in the first direction and spaced from each other in the second direction;

a first plurality of memory lines in the peripheral region between the first and second wiring levels in the third direction, each memory line being between a third conductive line and a fourth conductive line and extending coextensively in the first direction with the third and fourth conductive lines, wherein the memory cells and the memory lines are comprised of same materials, and a capacitor element is formed in the peripheral region by the plurality of first conductive lines, the plurality of second conductive lines, and the first plurality of memory lines.

18. The semiconductor device according to claim 17, further comprising:

a first connection line in the second wiring level in the peripheral region and extending in the second direction, ends of a first subset of the plurality of second conductive lines being connected to the first connection line; and a second connection line in the second wiring level in the peripheral region and extending in the second direction, the second connection line being spaced from the first connection line in the first direction, ends of a second subset of the plurality of second conductive lines being connected to the second connection line, wherein the capacitor element comprises an interdigitated comb structure.

19. The semiconductor device according to claim 18, wherein every second conductive line in the first subset is adjacent to a second conductive line in the second subset.

20. The semiconductor device according to claim 17, further comprising:

a second plurality of memory cells in the memory region above the second wiring level in the third direction.

* * * * *